(12) United States Patent
Wells et al.

(10) Patent No.: US 11,056,912 B1
(45) Date of Patent: Jul. 6, 2021

(54) POWER SYSTEM OPTIMIZATION USING HIERARCHICAL CLUSTERS

(71) Applicant: PXiSE Energy Solutions, LLC, San Diego, CA (US)

(72) Inventors: Charles H. Wells, San Diego, CA (US); Raymond A. de Callafon, San Diego, CA (US); Sai Akhil Reddy Konakalla, La Jolla, CA (US); Patrick T. Lee, San Diego, CA (US)

(73) Assignee: PXiSE Energy Solutions, LLC, San Diego, CA (US)

( * ) Notice: Subject to any disclaimer, the term of this patent is extended or adjusted under 35 U.S.C. 154(b) by 0 days.

(21) Appl. No.: 17/157,846

(22) Filed: Jan. 25, 2021

(51) Int. Cl.
| | |
|---|---|
| *H02J 13/00* | (2006.01) |
| *G01R 19/25* | (2006.01) |
| *G06Q 50/06* | (2012.01) |
| *H02J 3/00* | (2006.01) |
| *G06Q 10/04* | (2012.01) |

(52) U.S. Cl.
CPC .... *H02J 13/00032* (2020.01); *G01R 19/2513* (2013.01); *G06Q 10/04* (2013.01); *G06Q 50/06* (2013.01); *H02J 3/003* (2020.01); *H02J 3/004* (2020.01); *H02J 13/00016* (2020.01); *H02J 13/00022* (2020.01)

(58) Field of Classification Search
CPC ...... H02J 13/00032; H02J 3/004; H02J 3/003; H02J 13/00022; H02J 13/00016; G06Q 50/06; G06Q 10/04; G01R 19/2513
See application file for complete search history.

(56) References Cited

U.S. PATENT DOCUMENTS

| | | | |
|---|---|---|---|
| 4,251,735 | A | 2/1981 | Coleman |
| 6,819,087 | B2 | 11/2004 | Delmerico et al. |

(Continued)

FOREIGN PATENT DOCUMENTS

| | | |
|---|---|---|
| CN | 102185326 A | 9/2011 |
| CN | 102707628 A | 10/2012 |

(Continued)

OTHER PUBLICATIONS

Patent Cooperation Treaty, International Search Report for PCT/US2017/034765, dated Oct. 9, 2017.

(Continued)

*Primary Examiner* — Ziaul Karim
(74) *Attorney, Agent, or Firm* — Jones Day

(57) ABSTRACT

A power flow schedule of a cluster is determined by calculating sensitivity of the net power exchange bounds. Each cluster includes a different section of the power system. The cluster provides to another cluster the power flow schedule and the net power exchange bounds for determination of a second power flow schedule by another cluster based on collective net power exchange bounds, a forecast power supply of the plurality of clusters, and a forecast power demand schedule. The clusters are hierarchically arranged such that the another cluster is higher in a hierarchy than the cluster. The cluster receives from the another cluster the second power flow schedule. The first power flow schedule is adjusted locally within the cluster based on the second power schedule and the net power exchange bounds of the cluster. The power output of the cluster is controlled using the adjusted first power flow schedule.

23 Claims, 13 Drawing Sheets

(56) References Cited

U.S. PATENT DOCUMENTS

| | | |
|---|---|---|
| 6,985,800 B2 | 1/2006 | Rehtanz et al. |
| 7,096,175 B2 | 8/2006 | Rehtanz et al. |
| 7,274,975 B2 | 9/2007 | Miller |
| 7,490,013 B2 | 2/2009 | Wells |
| 7,498,821 B2 | 3/2009 | Wells |
| 7,710,729 B2 | 5/2010 | Li et al. |
| 7,755,371 B2 | 7/2010 | Wells |
| 7,961,112 B2 | 6/2011 | Wells |
| 7,987,059 B2 | 7/2011 | Gong et al. |
| 8,022,575 B2 | 9/2011 | Korba et al. |
| 8,457,912 B1 | 6/2013 | Wells |
| 8,498,752 B2 | 7/2013 | Wells |
| 8,532,230 B2 | 9/2013 | Taft |
| 8,659,186 B2 | 2/2014 | Teichmann et al. |
| 8,738,191 B2 | 5/2014 | Aivaliotis et al. |
| 8,892,375 B2 | 11/2014 | Taft |
| 8,907,615 B2 | 12/2014 | Mills-Price et al. |
| 8,942,856 B2 | 1/2015 | Ren et al. |
| 9,037,425 B2 | 5/2015 | Yang et al. |
| 9,043,037 B2 | 5/2015 | Bhageria et al. |
| 9,166,500 B2 | 10/2015 | Wu et al. |
| 9,230,429 B2 | 1/2016 | McKinley et al. |
| 9,411,389 B2 | 8/2016 | Shi et al. |
| 9,444,257 B2 | 9/2016 | Wells |
| 9,496,715 B2 | 11/2016 | Wilson |
| 9,507,367 B2 | 11/2016 | Venayagamoorthy et al. |
| 9,588,156 B2 | 3/2017 | Glavic et al. |
| 9,634,850 B2 | 4/2017 | Taft et al. |
| 9,638,831 B1 | 5/2017 | Hoff |
| 10,523,008 B2 | 12/2019 | Rive |
| 2003/0035308 A1 | 2/2003 | Lynch et al. |
| 2004/0051387 A1 | 3/2004 | Lasseter et al. |
| 2005/0160128 A1 | 7/2005 | Fardanesh |
| 2007/0282547 A1 | 12/2007 | Howell et al. |
| 2008/0071482 A1 | 3/2008 | Zweigle et al. |
| 2008/0077336 A1 | 3/2008 | Fernandes |
| 2009/0066287 A1* | 3/2009 | Pollack ............... G06Q 50/06 320/101 |
| 2009/0216469 A1 | 8/2009 | Marik et al. |
| 2009/0315566 A1 | 12/2009 | Thiim |
| 2009/0319090 A1 | 12/2009 | Dillon et al. |
| 2011/0276194 A1 | 11/2011 | Emalfarb et al. |
| 2012/0280673 A1 | 11/2012 | Watanabe et al. |
| 2013/0043690 A1 | 2/2013 | Wilson et al. |
| 2013/0073108 A1 | 3/2013 | Kolwalkar |
| 2013/0073109 A1 | 3/2013 | Cheng et al. |
| 2013/0085616 A1 | 4/2013 | Wenzel |
| 2013/0218494 A1 | 8/2013 | Chiang et al. |
| 2013/0245949 A1 | 9/2013 | Abitrabi et al. |
| 2013/0262012 A1 | 10/2013 | O'Sullivan et al. |
| 2013/0322139 A1 | 12/2013 | Lee et al. |
| 2013/0338954 A1 | 12/2013 | Seki |
| 2014/0070617 A1 | 3/2014 | Detmers et al. |
| 2014/0074306 A1 | 3/2014 | Lu et al. |
| 2014/0074311 A1 | 3/2014 | Kearns et al. |
| 2014/0100705 A1 | 4/2014 | Shi et al. |
| 2014/0142779 A1 | 5/2014 | Stoettrup et al. |
| 2014/0159658 A1 | 6/2014 | Kiceniuk et al. |
| 2014/0172503 A1 | 6/2014 | Hammerstrom et al. |
| 2014/0188689 A1 | 7/2014 | Kalsi et al. |
| 2014/0244065 A1 | 8/2014 | Biswas et al. |
| 2014/0268957 A1 | 9/2014 | Khajehoddin et al. |
| 2014/0277599 A1 | 9/2014 | Pande et al. |
| 2014/0306534 A1 | 10/2014 | Shi et al. |
| 2014/0307494 A1 | 10/2014 | Wu et al. |
| 2015/0005967 A1 | 1/2015 | Jóhannsson et al. |
| 2015/0005970 A1 | 1/2015 | Zweigle et al. |
| 2015/0006141 A1 | 1/2015 | Enenkel et al. |
| 2015/0051852 A1 | 2/2015 | Pan et al. |
| 2015/0051856 A1 | 2/2015 | Chu et al. |
| 2015/0073735 A1 | 3/2015 | Abido et al. |
| 2015/0100282 A1 | 4/2015 | Shokooh et al. |
| 2015/0102674 A1 | 4/2015 | Rudolph et al. |
| 2015/0121160 A1 | 4/2015 | Baone et al. |
| 2015/0184550 A1* | 7/2015 | Wichmann ............... F01K 13/02 700/287 |
| 2015/0326160 A1 | 11/2015 | Diez-Maroto et al. |
| 2015/0371151 A1 | 12/2015 | Georgescu et al. |
| 2016/0003879 A1 | 1/2016 | Wilson et al. |
| 2016/0091537 A1 | 3/2016 | Gaarder et al. |
| 2016/0118878 A1 | 4/2016 | Alteneiji |
| 2016/0147215 A1 | 5/2016 | Baone et al. |
| 2016/0172854 A1* | 6/2016 | Zhou ............... H02J 3/466 700/291 |
| 2016/0179120 A1 | 6/2016 | Boardman et al. |
| 2016/0198245 A1 | 7/2016 | Rhoads et al. |
| 2016/0211664 A1 | 7/2016 | Subbotin et al. |
| 2016/0241035 A1 | 8/2016 | Shi et al. |
| 2016/0258363 A1* | 9/2016 | Tiwari ............... F02C 9/42 |
| 2016/0261115 A1* | 9/2016 | Asati ............... H02J 13/00 |
| 2016/0266559 A1 | 9/2016 | Shi et al. |
| 2016/0281607 A1* | 9/2016 | Asati ............... F01K 13/00 |
| 2016/0299187 A1 | 10/2016 | Liang et al. |
| 2016/0306373 A1 | 10/2016 | Mashima |
| 2016/0313197 A1 | 10/2016 | Acharya et al. |
| 2016/0320435 A1 | 11/2016 | Budhraja et al. |
| 2016/0329700 A1 | 11/2016 | O'Brien et al. |
| 2016/0329709 A1 | 11/2016 | Park et al. |
| 2016/0334447 A1 | 11/2016 | Parashar et al. |
| 2016/0344234 A1 | 11/2016 | Hund et al. |
| 2017/0012468 A1 | 1/2017 | Park |
| 2017/0017298 A1 | 1/2017 | Biswas et al. |
| 2017/0104366 A1 | 4/2017 | Münz |
| 2017/0109524 A1 | 4/2017 | Kolacinski et al. |
| 2017/0194814 A1 | 7/2017 | Chakraborty et al. |
| 2017/0285111 A1 | 10/2017 | Fife |
| 2017/0346286 A1 | 11/2017 | Wells et al. |
| 2017/0346291 A1 | 11/2017 | Wells et al. |
| 2018/0123388 A1 | 5/2018 | Itaya |
| 2018/0224814 A1 | 8/2018 | Elbsat et al. |
| 2018/0294649 A1 | 10/2018 | Bright et al. |
| 2018/0356770 A1 | 12/2018 | ElBsat et al. |
| 2018/0356782 A1 | 12/2018 | ElBsat et al. |

FOREIGN PATENT DOCUMENTS

| | | |
|---|---|---|
| CN | 203166515 U | 8/2013 |
| CN | 103414245 A | 11/2013 |
| CN | 103474992 A | 12/2013 |
| CN | 103632313 A | 3/2014 |
| CN | 104242462 A | 12/2014 |
| CN | 104297632 A | 1/2015 |
| CN | 104865474 A | 8/2015 |
| CN | 105224811 A | 1/2016 |
| CN | 105375484 A | 3/2016 |
| CN | 105529704 A | 4/2016 |
| CN | 106383287 A | 2/2017 |
| CN | 106443246 A | 2/2017 |
| EP | 1 830 447 A1 | 9/2007 |
| EP | 1 919 076 A2 | 5/2008 |
| EP | 2 182 207 A2 | 5/2010 |
| KR | 20160038927 A | 4/2016 |
| WO | 2011150247 A1 | 12/2011 |
| WO | 2014061889 A1 | 4/2014 |
| WO | 2017210124 A1 | 12/2017 |
| WO | 2014138896 A1 | 9/2018 |

OTHER PUBLICATIONS

Patent Cooperation Treaty, Written Opinion of the International Searching Authority for PCT/US2017/034765, dated Oct. 9, 2017.

\* cited by examiner

POWER SYSTEM OPTIMIZATION USING HIERARCHICAL CLUSTERS

TECHNICAL FIELD

The current subject matter relates to electrical power grids and, more specifically, to methods and systems for optimizing power flow within a power system using hierarchical clusters.

BACKGROUND

Commercial and residential users are adding photovoltaic (PV) and/or energy storage to the power system at increasing rates. This is due in part to decreasing prices of PV rooftop generation systems and/or falling costs for energy storage (e.g., distributed energy resources (DERs)). Additionally, individuals are becoming more aware of the need to reduce their carbon footprint. The addition of power generation sources can cause distribution within the power network including voltage and current flows as well as voltage instability.

Additional power distribution system stress can be caused by reverse power flow over networks designed for one-way power flow. Many existing distribution networks are being operated beyond their expected lifetime adding stress due to aging equipment. These aging systems are experiencing more frequent outages due to deteriorating equipment and/or increasing intermittent flows of power from the new DERs being installed. With modest levels of DERs, reverse power flows can occur during times of low load and high generation. This in turn can cause protective equipment to mis-operate and cause more frequent outages.

SUMMARY

In one aspect, a method of determining an optimal power profile for a plurality of clusters within a power system having one or more energy storage units includes determining, locally within a first cluster of the plurality of clusters, a first power flow schedule of the first cluster by calculating sensitivity matrices that quantify net power exchange bounds of the first cluster. Each cluster includes a different section of the power system. The first cluster provides to a second cluster via a communication network, after the determining, (i) the first power flow schedule and (ii) the net power exchange bounds of the first cluster for determination of a second power flow schedule by the second cluster based on (i) collective net power exchange bounds of the plurality of clusters, (ii) a forecast power supply of the plurality of clusters, and (iii) a forecast power demand schedule. The first cluster and the second cluster are hierarchically arranged such that the second cluster is higher in a hierarchy than the first cluster. The first cluster receives from the second cluster, after the providing, the second power flow schedule. After the receiving, locally within the first cluster, the first power flow schedule is adjusted based on the second power schedule and the net power exchange bounds of the first cluster. Power output of the first cluster is controlled using the adjusted first power flow schedule.

In some variations, the sensitivity matrices associated with each cluster of the plurality of clusters can include (i) a real power voltage sensitivity matrix, $S_P$, and (ii) a reactive power voltage sensitivity matrix, $S_Q$. The real power voltage sensitivity matrix can be expressed by:

$$S_P = \begin{bmatrix} \delta V_1/\delta P_1 & \cdots & \delta V_1/\delta P_m \\ \vdots & \ddots & \vdots \\ \delta V_n/\delta P_1 & \cdots & \delta V_n/\delta P_m \end{bmatrix},$$

where n is a node within a respective cluster, m is a number of distributed energy resources within the respective cluster, V is a voltage of the node, P is a real power of the node, and δ is a change in voltage of the node. The reactive power voltage sensitivity matrix, $S_Q$, can be expressed by:

$$S_Q = \begin{bmatrix} \delta V_1/\delta Q_1 & \cdots & \delta V_1/\delta Q_m \\ \vdots & \ddots & \vdots \\ \delta V_n/\delta Q_1 & \cdots & \delta V_n/\delta Q_m \end{bmatrix}$$

wherein Q is a reactive power of the node.

In other variations, the determining, the providing, the receiving, and the adjusting occur over a planning period comprising a plurality of intervals. A State of Charge (SoC) of each energy storage unit can be managed towards a targeted SoC level at an end of the planning period. The planning period can be a sliding window of time over which the first power flow schedule, the second power flow schedule, and the third power flow schedule are computed.

In some variations, the first cluster can include at least one of a gas turbine, a diesel engine, a coal fired generator, a solar photovoltaic panel, a wind turbine, a hydro turbine, a battery, a distributed energy resource, an aggregator for managing distributed energy resources, a generation facility energy management system, or a virtual power plant.

In other variations, the first power flow schedule can be determined by calculating a standard deviation of voltages within the first cluster. The standard deviation can be used to identify a lowest value of an average voltage of the first cluster.

In some variations, each of the first power flow schedule, the second power flow schedule, and the third power flow schedule can include at least one of a real power flow, a reactive power flow, or an apparent power flow.

In other variations, each of the first cluster and the second cluster can be at least one of an alternating current (AC) cluster or a direct current (DC) cluster.

In some variations, the communication network includes at least one of a wired communication network or a wireless communication network.

In other variations, the net power exchange bounds of each cluster comprises (i) a minimum net power exchange bound and (ii) a maximum net power exchange bound.

In another aspect, a method of determining an optimal power profile for a plurality of clusters of a power system having one or more energy storage units includes receiving, from a first cluster by a second cluster via a communication network, (i) a first power flow schedule determined by the first cluster and (ii) net power exchange bounds of the first cluster. Each cluster includes a different section of the power system. A second power flow schedule is determined, locally within the second cluster, based on (i) collective net power exchange bounds of the plurality of clusters including the net power exchange bounds of the first cluster, (ii) a forecast power supply of the plurality of clusters, and (ii) a forecast power demand schedule. The first cluster and the second cluster are hierarchically arranged such that the second cluster is higher in a hierarchy than the first cluster. The second cluster provides to the first cluster via the communication network, after the determining, the second power flow schedule for further control of power output of the first cluster.

Systems are also described that include one or more data processors and memory storing instructions which when executed by one or more data processors perform operations described herein. Non-transitory computer program products (i.e., physically embodied computer program products) are also described that store instructions, which when executed by one or more data processors of one or more computing systems, cause at least one data processor to perform operations described herein. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

The subject matter described herein provides many technical advantages. For example, use of the current subject matter addresses system (e.g., resource and network) constraints, system reliability, and achieves network operational optimality while remaining within a voltage stability margin. This hierarchical method of control described herein provides a technique for using hierarchical control technology to regulate the entire power grid. This control architecture allows the grid to be operated optimally with high levels of DER power generation from the cluster level including cases where power demand is satisfied by the renewable generation sources distributed at various voltage levels in the network.

The details of one or more variations of the subject matter described herein are set forth in the accompanying drawings and the description below. Other features and advantages of the subject matter described herein will be apparent from the description and drawings, and from the claims.

DESCRIPTION OF DRAWINGS

Like reference symbols in the various drawings indicate like elements.

DETAILED DESCRIPTION

The systems, products, and methods described herein provide for control of the both real and reactive power flow within a power system having one or more energy storage units using hierarchical clusters. The power system is decomposed in a plurality of hierarchical clusters (e.g., parent clusters and leaf clusters). Various power flow schedules are sequentially calculated over a planning horizon (or period) by the clusters in order to determine an optimal power flow schedule for the leaf clusters. The various power flow schedules facilitate control of real and/or reactive power flow at points in the power system (or grid).

Figure 1:
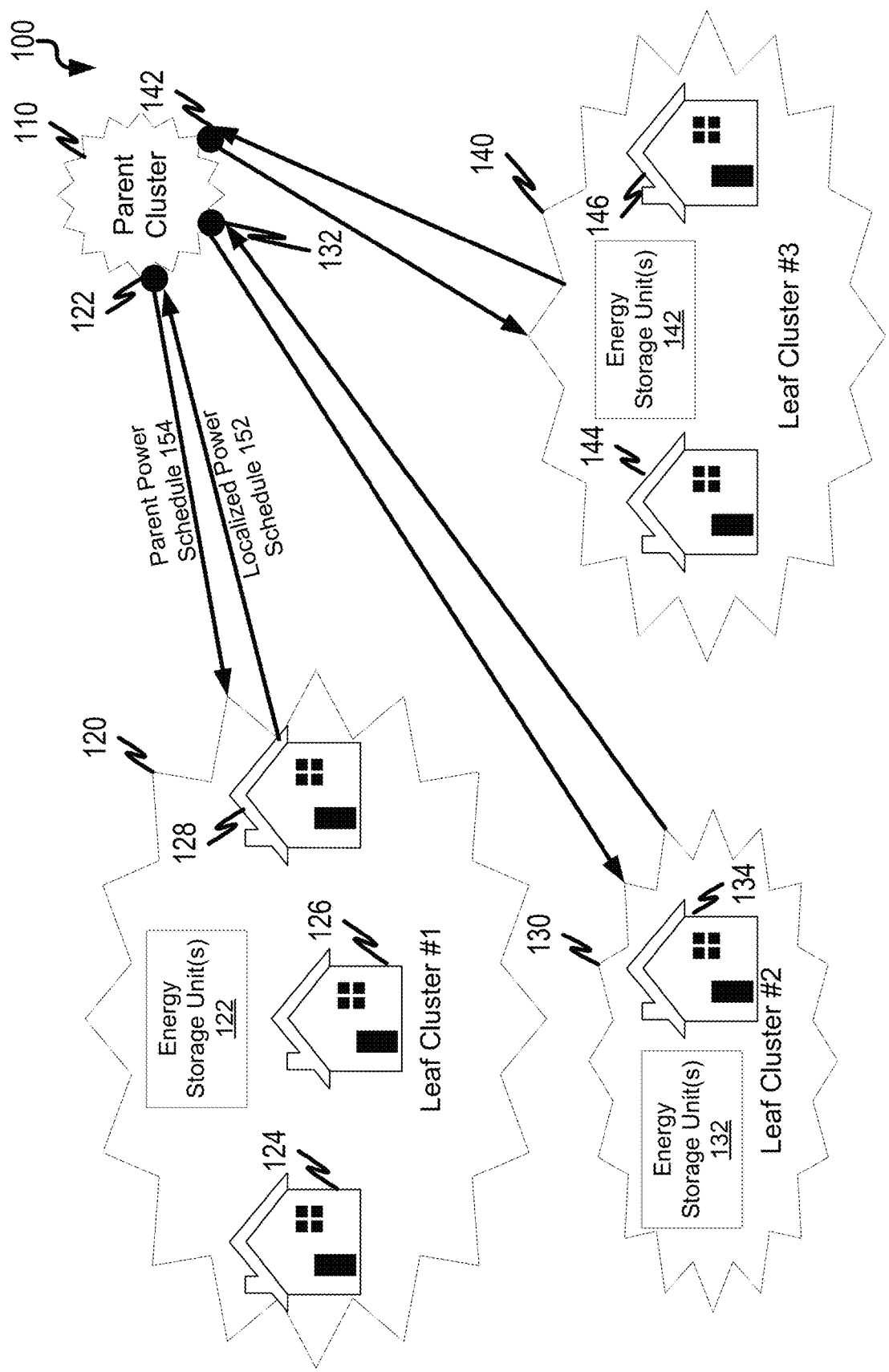
FIG. 1 illustrates a block diagram of a power system decomposed into a number of hierarchical clusters: parent cluster and leaf clusters.

FIG. 1 illustrates a block diagram of a power system 100 decomposed into a number of hierarchical clusters: parent cluster 110 and leaf clusters 120, 130, 140. The clusters (e.g., parent cluster 110 and leaf clusters 120, 130, 140) can be defined into a hierarchy based on voltage levels, as described in more detail in FIG. 3. Leaf clusters 120, 130, 140 are the lowest level clusters in the power system 100, which manage physical power assets such as loads (e.g., one or more loads 124, 126, 128, 134, 144, 146), distributed energy resources (DERs), and/or other energy storage units (e.g., one or more energy storage units 122, 132, 142). Each leaf cluster 120, 130, 140 has one aggregate logical connection (PCC) to its parent cluster. This aggregate logical connection is also known as the Point of Interconnection (POI). For example, POI 122 couples leaf cluster 120 to parent cluster 110, POI 132 couples leaf cluster 130 to parent cluster 110, and POI 142 couples leaf cluster 140 to parent cluster 110.

Figure 2:
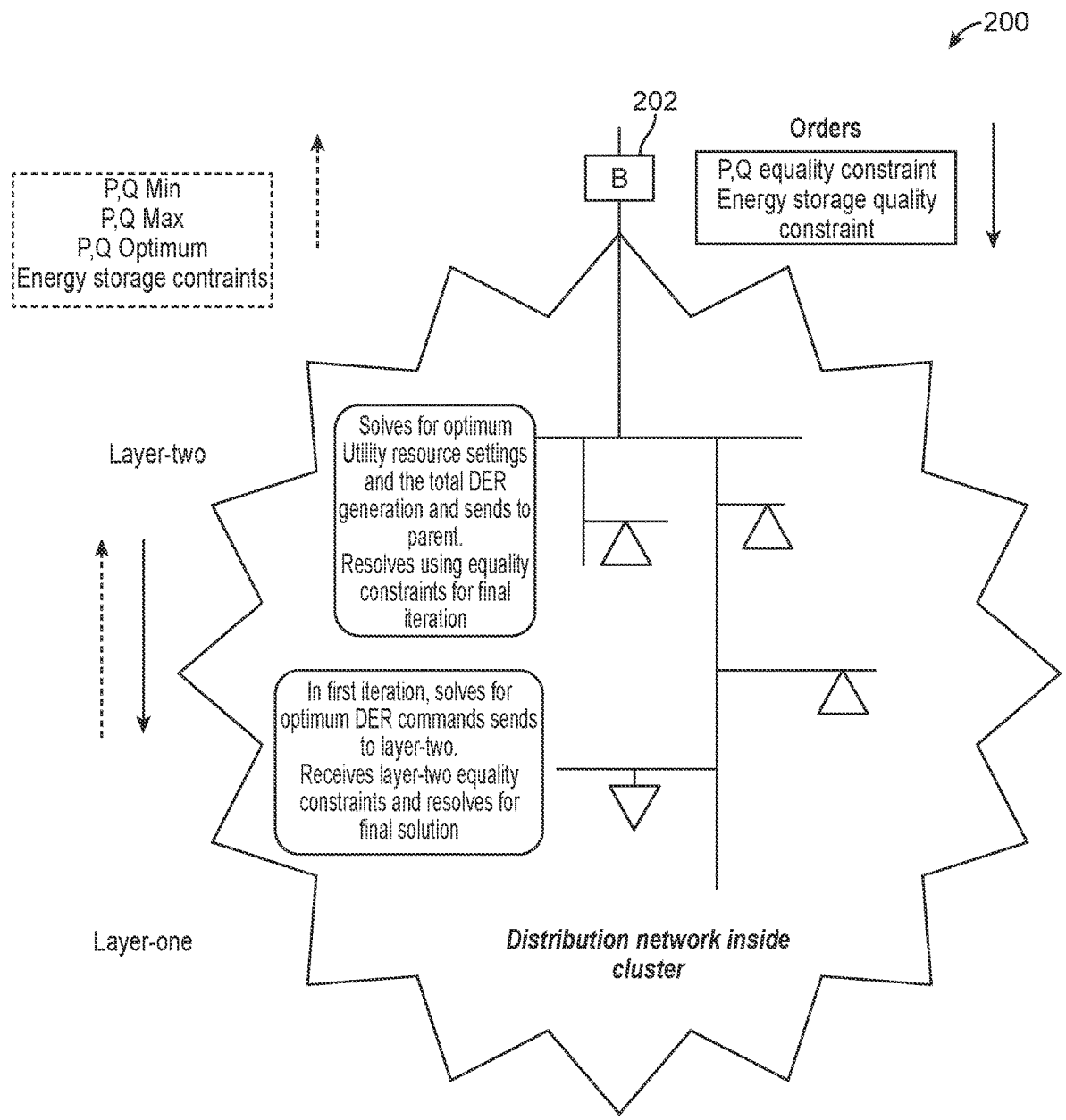
FIG. 2 illustrates a block diagram of optimizing power flow schedules of a leaf cluster.

FIG. 2 illustrates a block diagram 200 of optimizing power flow schedules of a leaf cluster. The power output of each leaf cluster 120, 130, 140 can be controlled utilizing a multi-step optimization approach. Consider for example, controlling the real and/or reactive power output of leaf cluster 120. A localized power flow schedule 152 is first determined locally for leaf cluster 120 using net power exchange bounds associated with the one or more energy storage units 122 and/or loads 124, 126, 128. Additional operational settings associated with the leaf cluster 120 can be considered including, but not limited to, a number of charge/discharge cycles of a storage system, efficiency of DERs, sensitivity of DERs on the network, fair play dispatch/curtailment schemes for customers, and the like. The net power exchange bounds include considerations of a SOC of storage DERs at the beginning of the planning period be equal at the end of the planning interval, SOC of storage DERs at the optimization execution period be equal to an estimated value at the end of the following N time-period.

The localized power flow schedule 152 includes real and/or reactive power setpoints and is provided to the parent cluster 110. The parent cluster 110 then determines a parent schedule 154 that collectively takes into account (i) the net power exchange bounds of each of the leaf clusters 120, 130, 140 (b) a forecast power supply of the leaf clusters 120, 130, 140, and (c) a forecast power demand schedule of the power system 100. The parent power schedule 154, like the localized power schedule, includes real and/or reactive power setpoints. The parent power schedule 154 is unique to leaf cluster 120. The parent power schedule each cluster can be split base on factors including, but not limited to, rating, capacity (e.g., storage DERs), nodal sensitivity, priority, fairness factor (e.g., market DERs), and the like. Leaf cluster 120 then takes the parent power schedule 154 and adjusts the localized power schedule 152 accordingly. Leaf cluster 120 then uses an adjusted localized power schedule 152 to control power within the cluster. This optimization is performed over a planning period (e.g., 24 hours). The planning period can be divided into time intervals (e.g., five-minute intervals) such that the techniques described herein are performed during each interval over the planning period. This is so as to minimize a user configurable set of objective functions such as but not limited to economics, reliability and emissions, subject to specification limits on power system constraints such as voltage on each bus, flow (e.g., current) limits on each branch in the network, capability (e.g., rating) of non-renewable generation sources, capability (e.g., rating and/or capacity) of the storage systems and forecasted capability (e.g., generation) of renewable sources.

Each leaf cluster 120, 130, 140 can also be connected to a microgrid such as a microgrid defined in IEEE 2030.5 standards. Each cluster can also be operated as an island by opening one or more breakers 202. Frequency control inside the island can be provided by using one or more inverters in voltage source mode. The island cluster can resynchronize with the main power grid via the one or more breakers.

The real and reactive power setpoints (e.g., power flow schedule) at the POI of each cluster can be determined by the next level in the control hierarchy (e.g., the parent cluster 110). Alternatively, the leaf cluster 120, 130, 140 can opt-out and determine its own optimal settings based on its respective loads and/or energy storage units. When a leaf cluster opts out, it is a known disturbance for its parent cluster.

For simplicity and ease of understanding, the power schedules associated with leaf cluster 120 were discussed. But it is understood that each individual leaf cluster can generate its own localized power schedule based on its own loads and/or energy storage units. This can be communicated to the parent cluster 100 as discussed with reference to leaf cluster 120. In turn, parent cluster 100 can provide power schedules unique to each leaf cluster.

Figure 3:
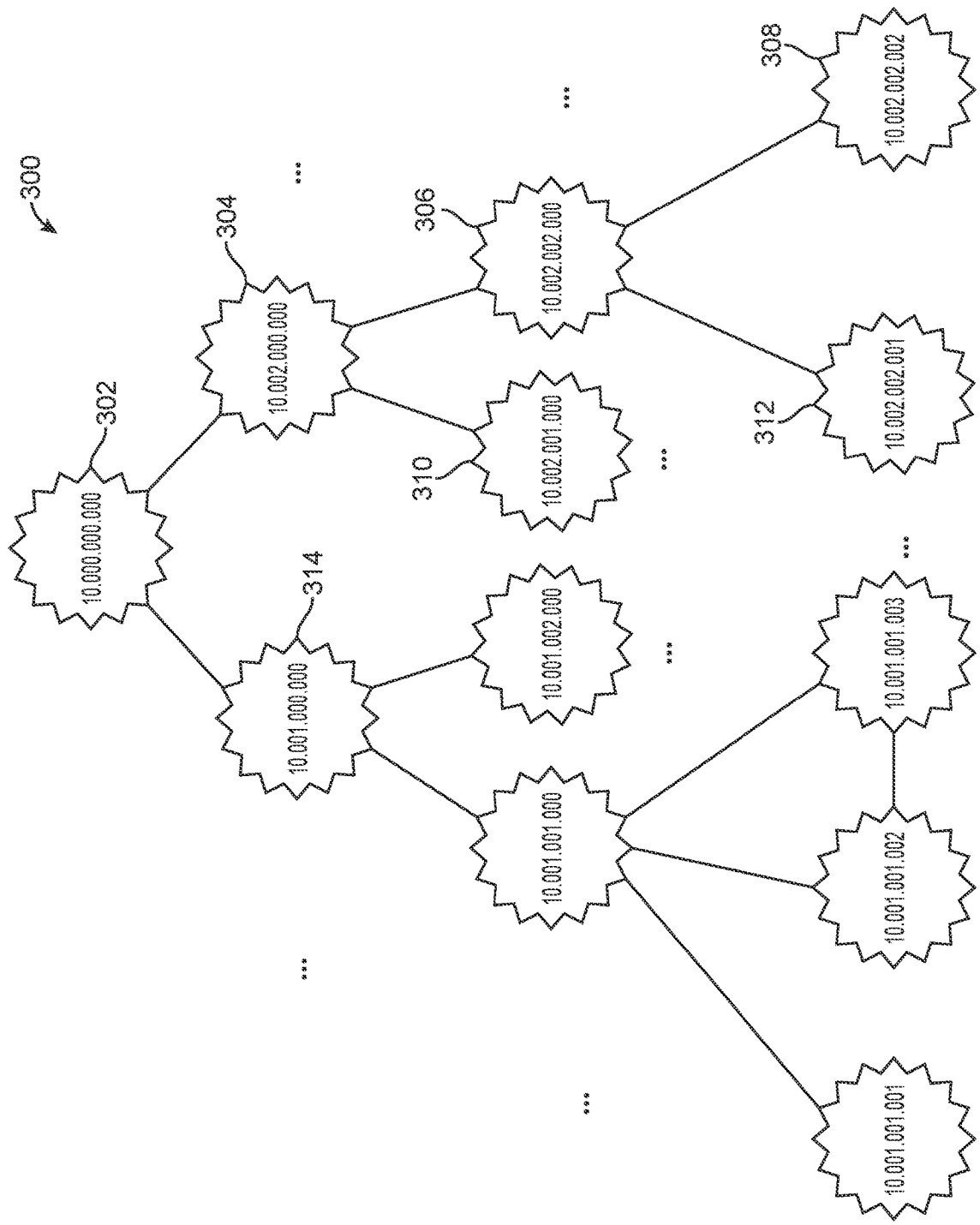
FIG. 3 illustrates a block diagram plurality of hierarchical clusters.

FIG. 3 illustrates a block diagram 300 plurality of hierarchical clusters 302, 304, 306, 308, 310, 312, 314. Clusters can be arranged hierarchically such that a cluster such as cluster 306 is coupled to a parent cluster 302. Parent cluster 304 operates at a voltage level that is higher in the power system than the cluster 306. Cluster 306 also has a number of child clusters 308, 312 that operate at a voltage level that is lower in the power system than the cluster 306. The lowest level of clusters in the power system are known as leaf clusters (e.g., clusters 308, 312). The top most cluster in the power system is known as the root cluster (e.g., cluster 302). As illustrated in FIG. 3, cluster 302 is known as the parent cluster to clusters 304, 314. In other words, clusters 304, 314 are child clusters to cluster 302. Similarly, cluster 304 is the parent cluster to clusters 306, 310, which are in turn child clusters to cluster 304. Following suit, cluster 306 is the parent cluster to clusters 308, 312, which in turn are child clusters to cluster 306.

The optimization described herein initiates at a leaf cluster (e.g., cluster 308 or 312) and proceeds upward to the root cluster (e.g., cluster 302). The upward information on the first iteration of the optimization are the net power exchange bounds on the cluster including the estimated optimal real and reactive power profiles (e.g., power flow schedules). This information flows up the hierarchy, with optimization occurring at each intermediary cluster (e.g., clusters 304, 306), to the root cluster 302. The root cluster 302 then determines a power flow schedule defining the real and reactive equality net power exchange bounds for each of its child clusters. The child clusters in-turn adjust their determined power flow schedule using the power flow schedule provided by its parent cluster. In turn, the intermediary clusters provide the adjusted power flow schedules to its child clusters. This continues to the leaf cluster (e.g., 308, 312) terminating the optimization at each time step.

Figure 4:
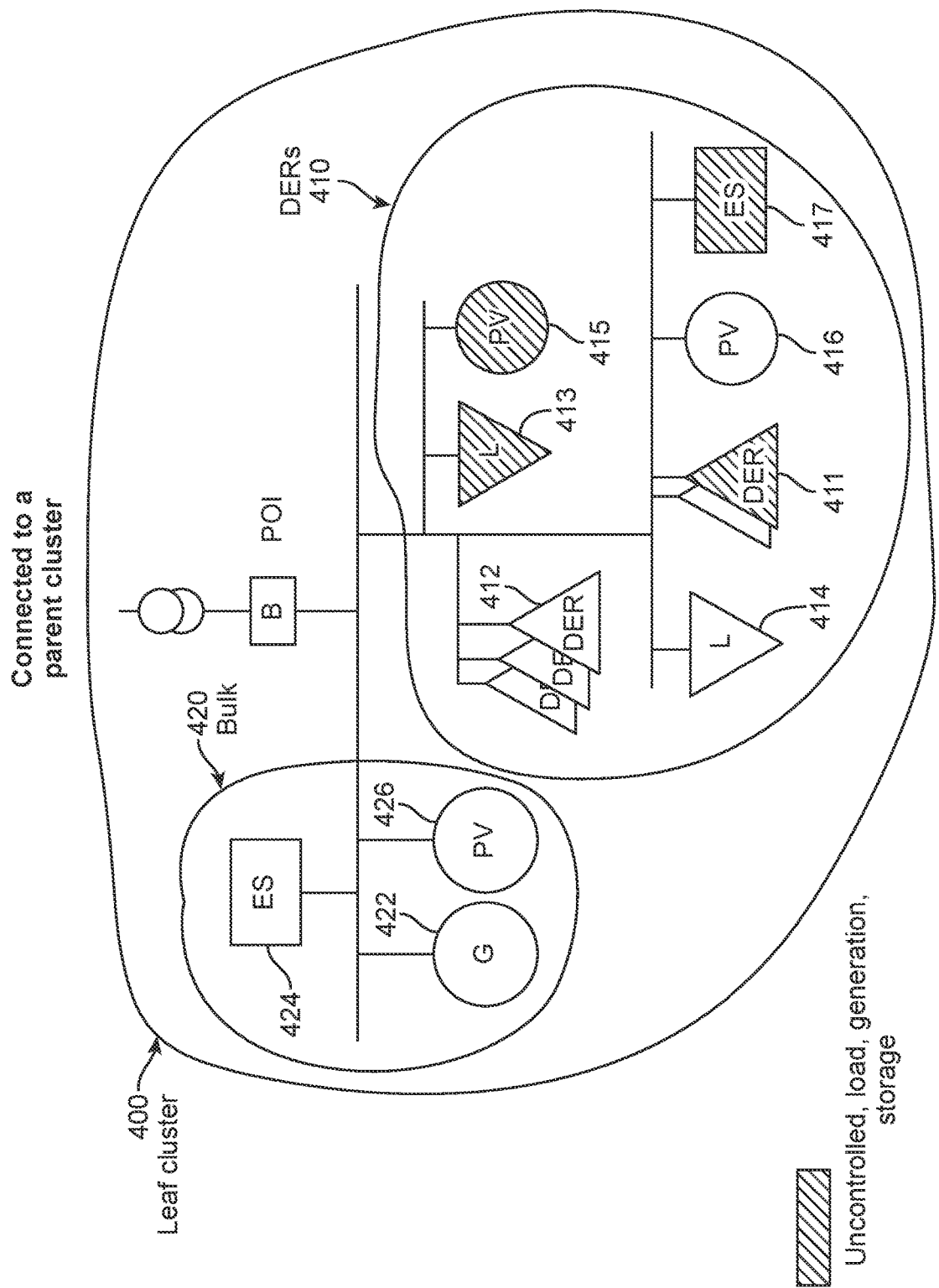
FIG. 4 illustrates an example leaf cluster.

FIG. 4 illustrates an example leaf cluster 400. Clusters, including leaf cluster 400, can be formed by spanning a graph of the power system 100 and locating co-trees (e.g., groupings of parent and child clusters). The graph includes a single root node with multiple co-trees in the hierarchy until reaching the leaf clusters that contain the controllable and uncontrollable assets (e.g., one or more energy storage units and/or loads). At each level in the hierarchy, both utility and customer owned DERs can exist.

Each leaf cluster 400 can include one or more DERs 410 and bulk elements 420. For example, leaf clusters 120, 130, 140 can include, but are not limited to, (i) utility operated fossil fueled generators such as gas turbines, diesel engines, coal fired generators, and the like, (ii) utility operated renewable generators such as solar PV, wind, hydro, and the like, (iii) utility operated energy storage devices such as batteries and the like, (iv) controllable customer owned DERs (with or without energy storage), (v) aggregators that manage a set of DERs downstream, (vi) generation facility energy management systems (GFEMS), and/or (vii) virtual power plants. Leaf clusters 120, 130, 140 can also contain DERs that include solar generation equipment and/or energy storage units. The DERs can be customer owned or owned by a utility company.

Some of the DERs and corresponding components can be controllable through receiving commands from a control system such as one or more DERs 412, one or more loads 414, and/or one or more PVs 416. Other DERs and corresponding components may not controllable, but their values can be taken into account in forecasting loads and generation, such as one or more DERs 411, one or more loads 413, one or more PVs 415, and/or one or more energy storage units 417. The utility controlled solar and generation as well as energy storage can also be controlled by an optimizing controller described herein.

Bulk elements 420 can include generators 422 (e.g., utility operated fossil fueled generators such as gas turbines, diesel engines, coal fired generators, utility operated renewable generators such as solar PV, wind, hydro, and the like), energy storage units 424 (e.g., utility operated energy storage devices such as batteries and the like), and/or PVs 426.

Each cluster has net power exchange bounds (e.g., minimum and maximum bounds) due to capacity limitations on the devices within the clusters being controlled and/or physical power system bounds such as ampacity and voltage limits. These net power exchange bounds apply to the power system components inside the cluster. Each cluster optimization can maximize both objective functions subject to limits on the bounds of the power system to carry the power flow (e.g., real and/or reactive power flow) to its child clusters or DERs.

Figure 5:
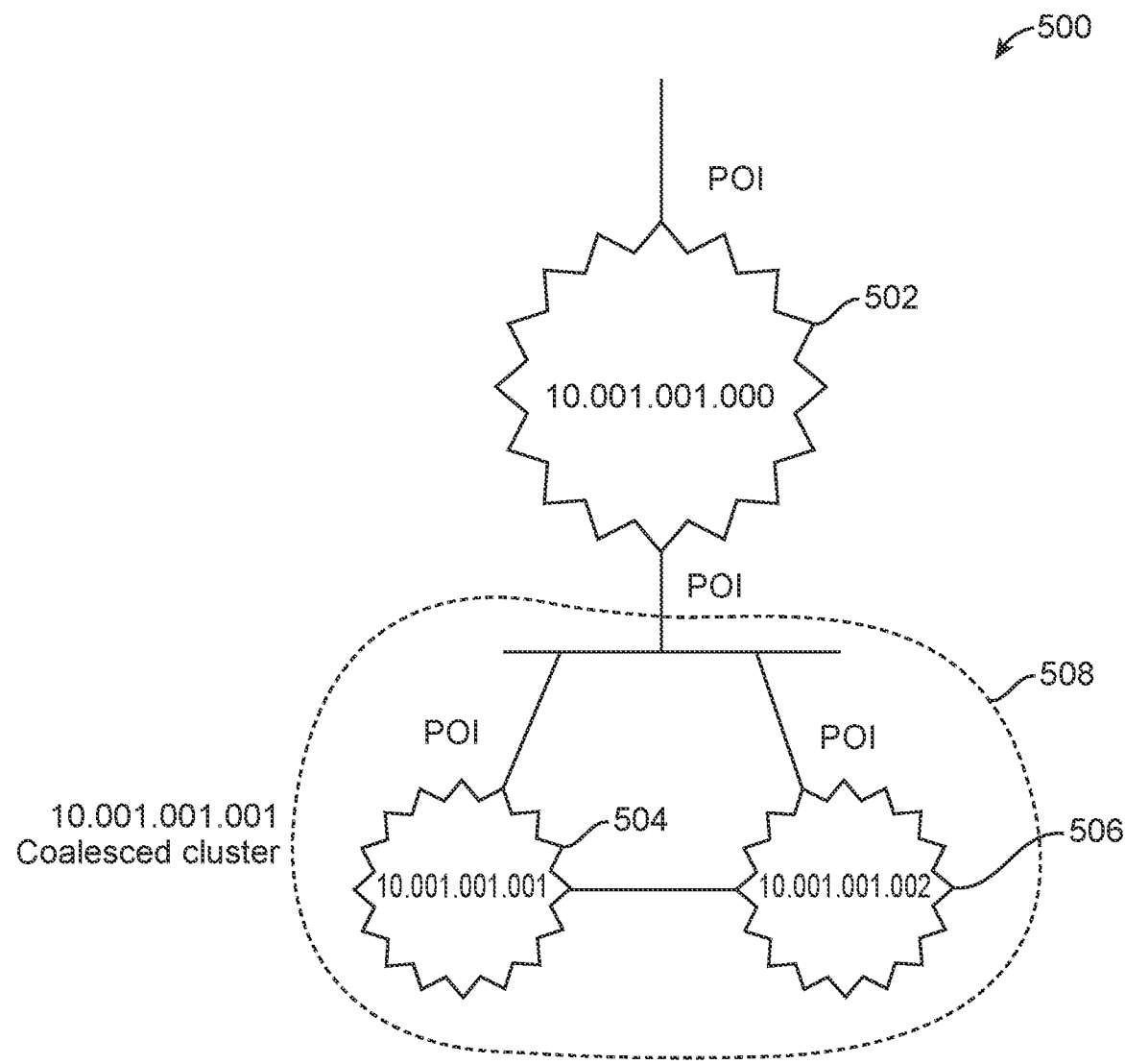
FIG. 5 illustrates a block diagram a plurality of hierarchical clusters with a sibling cluster relationship.

FIG. 5 illustrates a block diagram 500 a plurality of hierarchical clusters 502, 504, 506 with a sibling cluster relationship. Parent cluster 502 includes two child clusters 504, 506. The child clusters 504, 506 have a sibling relationship that can be treated as a coalesced or single cluster 508 from the perspective of parent cluster 502.

Figure 6:
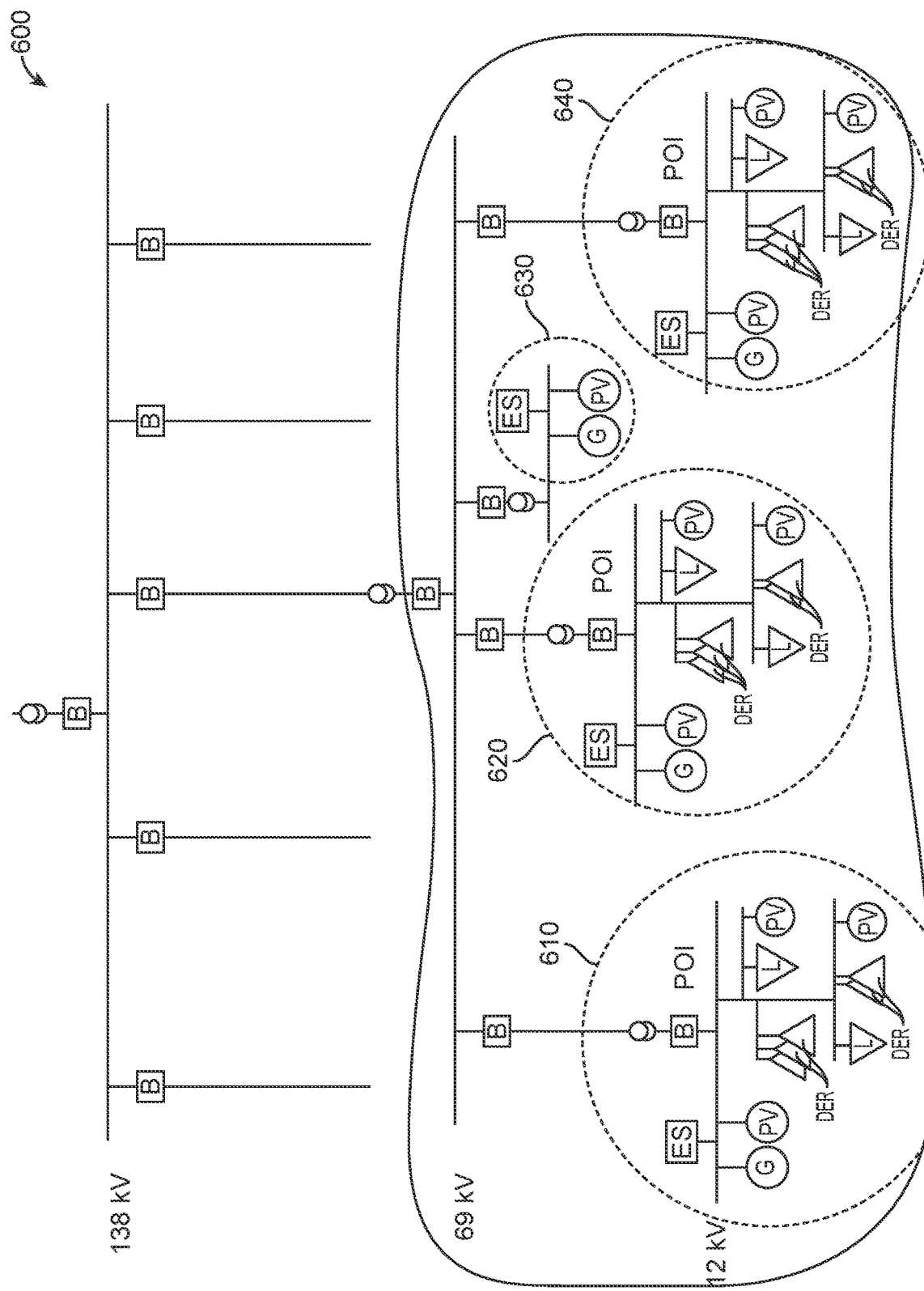
FIG. 6 illustrates a block diagram of another example cluster hierarchy.

FIG. 6 illustrates a block diagram 600 of another example cluster hierarchy. The cluster hierarchy illustrated in FIG. 6 includes clusters 610, 620, 630, 640. In this example, the cluster voltage level is 12 kV and the parent cluster is operating at 69 kV. The real and reactive power setpoints are computed by the 69 kV cluster controller, using the same optimization method as used in the 12 kV cluster controller. In this case the real and reactive power setpoints are computed subject to both the economic objective function for the group and the network constraints. Note as previously discussed in FIG. 4, there may be uncontrolled loads and/or generation sources connected within the cluster. The cluster controller considers these as disturbances, and controls power flows at the cluster PCC (or POI) by means of feedback control as described in any of the following U.S. Pat. Nos. 10,027,119; 10, 452,032; 10,599,175; 10,615,604; 10,714,938; and/or 10,742,068.

The hierarchy illustrated in FIG. 6 includes a 138 kV portion of a power distribution network. It is understood that this hierarchy can be extended to higher voltages such as 230 kV and 550 kV.

Figure 7:
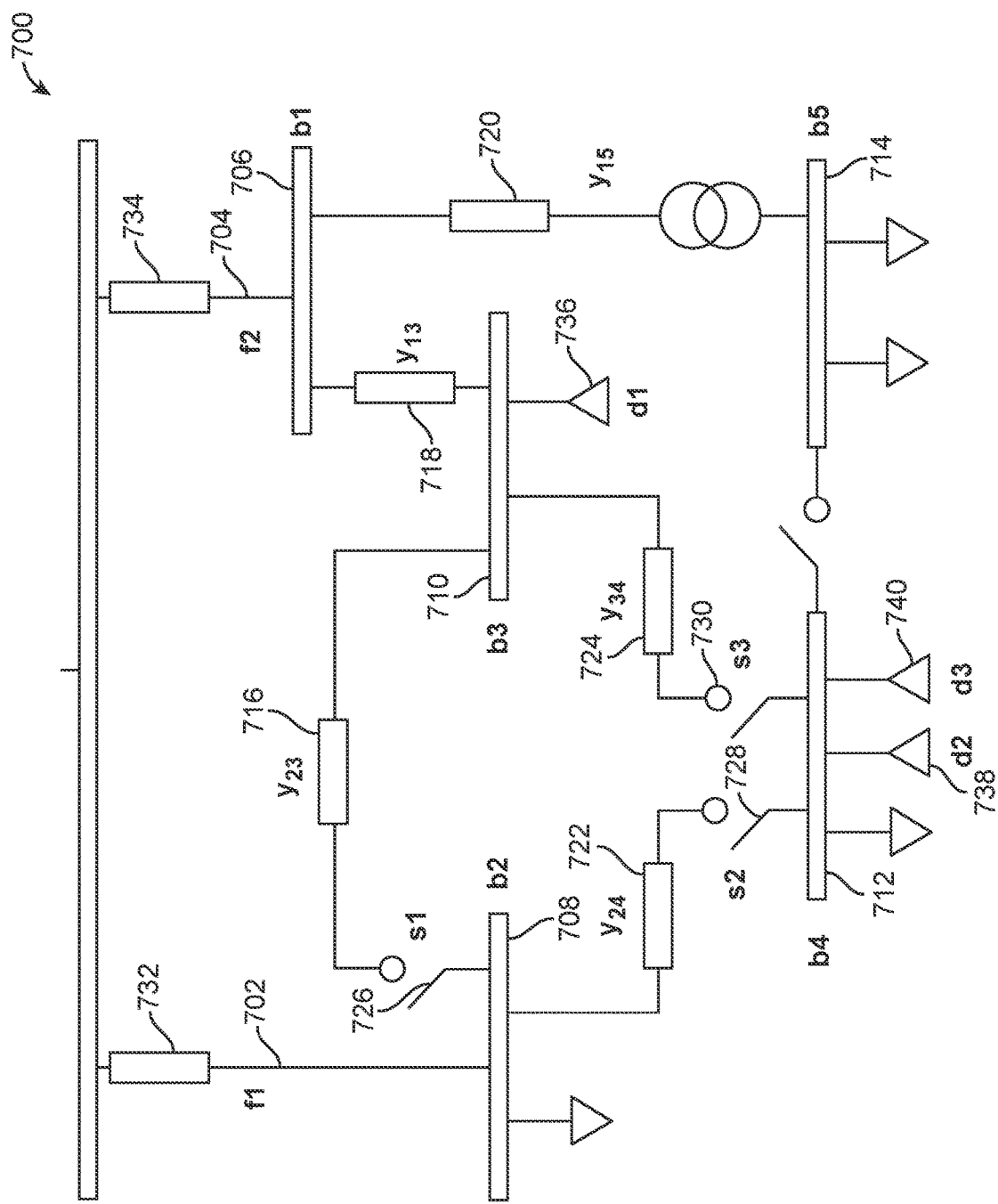
FIG. 7 illustrates a topology diagram representing different feeders ($f_i$), buses ($b_i$), branches with admittances ($y_i$), switches ($s_i$), loads, and DERs of an example power distribution system.

FIG. 7 illustrates a topology diagram representing different feeders ($f_i$) 702, 704, buses ($b_i$) 706, 708, 710, 712, 714, branches with admittances ($y_i$) 716, 718, 720, 722, 724, switches ($s_i$) 726, 728, 730, loads 732, 734, and DERs 736, 738, 740 of an example power distribution system 700. Each bus 706, 708, 710, 712, 714 can also have other controllable resources such as generators, energy storage units (e.g., batteries), and/or PVs that are not illustrated in FIG. 7. Such controllable resources may be owned and operated by a utility company, while DERs 736, 738, 740 may be owned by customers and controlled by a utility company.

The topology illustrated in FIG. 7 can be persisted as a static as-built representation of the network. The network can be made up with a connection of buses 706, 708, 710, 712, 714 (e.g., nodes). A node may be defined as a unit that has independent voltage phasor (e.g., degree of freedom). Connections between buses include switches 726, 728, 730 (e.g., to change connection), transformer (e.g., to change voltage), and/or admittances 716, 718, 720, 722, 724 (e.g., to model power/voltage loss).

The network topology can be represented in the database in the form of one or more tables or in the form of a connected graph or by means of a CIM XML, file (e.g., IEC 61970 Standard). The persisted topology can be represented as an admittance matrix where the rows represent the buses 706, 708, 710, 712, 714 (e.g., nodes) and the columns represent the branches 716, 718, 720, 722, 724 (e.g., edges). Because of the multiple uses of the topology, an in-memory data structure can be created from the central database. The in-memory structure can be in the form of a graph.

The in-memory network topology module can be called via an application programming interface (API). It is called to determine network constraints (e.g., net power exchange bounds) and sensitivities. The model can include the current switching status of the cluster network.

The output of the topology model can be a set of linked data structures that describe the membership of the DERs in the power system. The memberships can be assigned Functional Set Assignment (FSA) numbers as defined in the IEEE 2030.5 (SEP2) standard. Each DER can belong to one of up to 15 groups. The software module can determine the group number for each DER in the power system. The GTA functions access the graph in the container, apply real time properties to the edges of the graph and determine the "parentage" of all DERs in the system.

Figure 8:
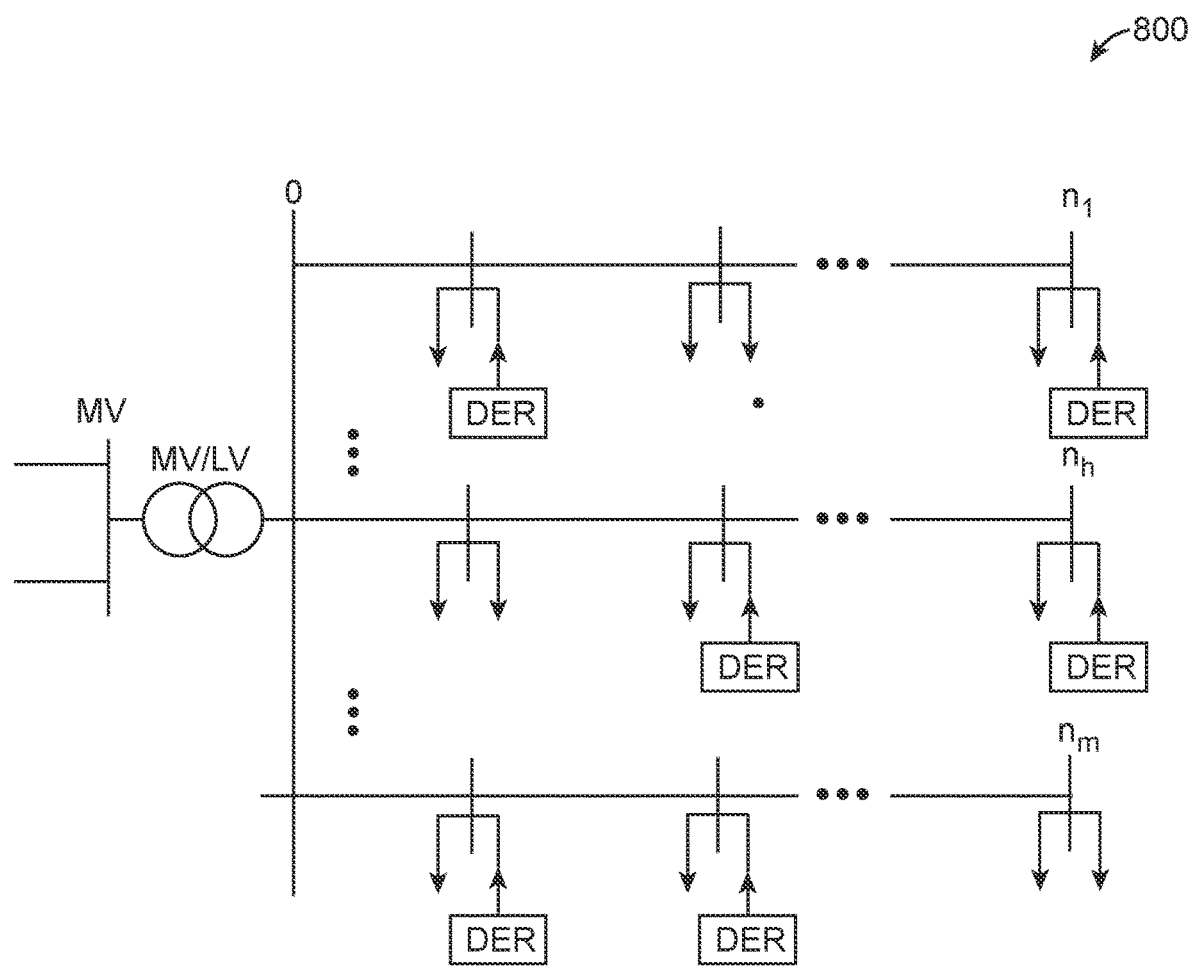
FIG. 8 illustrates a block diagram of a one-at-a-time power injection for DER sensitivity analysis.

FIG. 8 illustrates a block diagram 800 of a one-at-a-time power injection for DER sensitivity analysis. The voltage sensitivity at each node can be obtained using a model perturbation method. The voltage sensitivity at n nodes due to the perturbations of real and reactive power of m DERs can be defined by a n×m real power to voltage sensitivity matrix, $S_P$, represented by the following equation:

$$S_P = \begin{bmatrix} \delta V_1/\delta P_1 & \cdots & \delta V_1/\delta P_m \\ \vdots & \ddots & \vdots \\ \delta V_n/\delta P_1 & \cdots & \delta V_n/\delta P_m \end{bmatrix} \quad (1)$$

and a n×m reactive power to voltage sensitivity matrix, $S_Q$, represented by the following equation:

$$S_Q = \begin{bmatrix} \delta V_1/\delta Q_1 & \cdots & \delta V_1/\delta Q_m \\ \vdots & \ddots & \vdots \\ \delta V_n/\delta Q_1 & \cdots & \delta V_n/\delta Q_m \end{bmatrix} \quad (2)$$

where $V_i$ is a voltage of node i, P is a real power of node i, δ represents a partial derivative mathematical operator, and Q is the reactive power of node i. The partial derivatives in the n×m sensitivity matrices of equations (1) and (2) are obtained from a perturbation analysis approach. In this perturbation analysis approach, first the absolute values of nominal nodal voltages, $V_i^{nom}$, represented by the following equation:

$$V^{nom} = \begin{bmatrix} V_1^{nom} \\ \vdots \\ V_n^{nom} \end{bmatrix} \quad (3)$$

for the i=1, . . . , n nodes in the distribution circuit are computed by solving a load flow problem in an assigned initial nominal operating condition of real power and reactive power represented by the following expressions:

$$P_{DER}^{nom} = \begin{bmatrix} P_1^{nom} \\ \vdots \\ P_m^{nom} \end{bmatrix}, Q_{DER}^{nom} = \begin{bmatrix} Q_1^{nom} \\ \vdots \\ Q_m^{nom} \end{bmatrix} \quad (4)$$

of the j=1, . . . , m enumerated DERs in the distribution network inside the cluster. In some variations, the nominal values for either real power, $P_j^{nom}$, or reactive power, $Q_j^{nom}$, for each enumerated DER j=1, . . . , m may all be chosen to be 0. In other variations, these nominal values may be chosen to be non-zero to reflect the value of nominal loads or generation at each location of an enumerated DER j=1, . . . , m. Then, a small perturbation of the power injection of the kth DER, firstly of active power d$\delta P_k$ and secondly of reactive power dQk, is added to the nominal operating condition of real power, $P_k^{nom}$, and reactive power, $Q_k^{nom}$, of the kth DER and again a new load-flow is solved to compute the n node voltage absolute values $V_1, \ldots, V_n$. Finally, the kth column of the sensitivity matrices is evaluated as the ratios expressed by the following equations:

$$\begin{bmatrix} \delta V_1/\delta P_k \\ \vdots \\ \delta V_n/\delta P_k \end{bmatrix} \approx \begin{bmatrix} \dfrac{V_1 - V_1^{nom}}{dP_k} \\ \vdots \\ \dfrac{V_n - V_n^{nom}}{dP_k} \end{bmatrix} \tag{5}$$

and $$\begin{bmatrix} \delta V_1/\delta Q_k \\ \vdots \\ \delta V_n/\delta Q_k \end{bmatrix} \approx \begin{bmatrix} \dfrac{V_1 - V_1^{nom}}{dQ_k} \\ \vdots \\ \dfrac{V_n - V_n^{nom}}{dQ_k} \end{bmatrix} \tag{6}$$

between the variations of the nodal nodes with respect to their corresponding values in the initial operating condition and the perturbation of the real and reactive power of the considered kth DER injection. In particular, for the considered distribution power system, the same initial operating condition as the one adopted for the proposed method is assumed, in which all the power injections by the DERs are null. Then, small injections of active power (ex: 20% of rated) and of reactive power (e.g. 20% of rated) are imposed on one node at a time, for all the "P" nodes along the feeders: the variations of the system variables and the related sensitivity coefficients are obtained by "2*P" load-flow solutions. These sensitivity coefficients are used to re-allocate the % P/Q dispatch to DER/Aggregator/GFEMS of the network in case of any voltage constraint violations. The current constraint violations can be handled by simply lowering P/Q dispatch to DERs/Aggregators/GFEMS by a certain percentage as determined by a current-to-apparent power gain. Note that this is also a sensitivity matrix associated with the change in branch currents. This matrix takes the same form as the one shown above, but the dependent variable is current rather than voltage.

With the information of the network model, the location of DERs in the distribution network and the sensitivity of the distribution network with respect to real and reactive power injection, multiple embodiments to split aggregated power demand over several DERs in the distribution network can be realized.

In a first variation, the aggregated real power, $P^a$, and aggregated reactive power, $Q^a$, can be split to the m DERs in a distribution system simply based on the inverter constraints or power limitations of each enumerated DER j=1, ..., m in the distribution system. For this variation, let $P^m_j$ and $Q^m_j$ denote the maximum real and reactive power for each enumerated DER j=1, ..., m in the distribution system. Then the following expressions result:

$$P^m = \sum_{j=1}^{m} P^m_j, \quad Q^m = \sum_{j=1}^{m} Q^m_j \tag{7}$$

and the aggregated real power $P^a \leq P^m$ and aggregated reactive power $Q^a \leq Q^m$ can be split according to the following expressions:

$$P_j = P^a \cdot \dfrac{P^m_j}{P_m}, \quad Q_j = Q^a \cdot \dfrac{Q^m_j}{Q^m}. \tag{8}$$

In this variation, real and reactive power are split without explicitly checking any network constraints (e.g., net power exchange bounds). In this variation, computed real and reactive power values are automatically dispatched to the power sources. This includes the sending commands to customer DERs using the IEEE 2030.5 standard Internet protocol.

In the second variation, the aggregated real power, $P^a$, and aggregated reactive power, $Q^a$, can be split to the m DERs in a distribution system based on the size of a battery and inverter constraints or power limitations of each enumerated DER j=1, ..., m in the distribution system. For this variation, let $P^m_j$ and $Q^m_j$ denote the maximum real and reactive power and $B^m_j$ is the maximum battery size for each enumerated DER j=1, ..., m in the distribution system and define the following expressions:

$$P^m = \sum_{j=1}^{m} P^m_j, \quad Q^m = \sum_{j=1}^{m} Q^m_j, \quad B^m = \sum_{j=1}^{m} B^m_j \tag{9}$$

and the aggregated real power $P^a \leq P^m$ and aggregated reactive power $Q^a \leq Q^m$ can be split according to the following expressions:

$$P_j = \min\left(P^a \cdot \dfrac{P^m_j}{P_m}, \; P^a \cdot \dfrac{B^m_j}{B_m}\right) Q_j = Q^a \cdot \dfrac{Q^m_j}{Q^m}. \tag{10}$$

In this variations, real and reactive power are split without explicitly checking any network constraints (e.g., net power exchange bounds), but allows battery powered DERs to maintain a similar State of Charge (SoC) due to a real power splitting that takes into account the battery size. In this variation, computed real and reactive power values are automatically dispatched to the power sources. This includes the sending commands to customer DERs using the IEEE 2030.5 standard Internet protocol.

In a third variation, the aggregated real power, $P^a$, and aggregated reactive power, $Q^a$, can be split to the m DERs in a distribution system by taking into account inverter constraints or power limitations of each enumerated DER j=1, ..., m and taking into account the n×m voltage sensitivity matrices obtained from the perturbation analysis approach described earlier to minimize nodal or bus voltage deviations. In this embodiment, the sensitivity matrix is used to re-calculate the DER contributions to minimize nodal voltage deviations and thus minimize the possibility of voltage violations in the distribution system. For this embodiment, let $P^m_j$ and $Q^m_j$ denote the maximum real and reactive power for each enumerated DER j=1, ..., m in the distribution system and consider again the assigned initial nominal operating condition of real power and reactive power expressed by the following:

$$P_{DER}^{nom} = \begin{bmatrix} P_1^{nom} \\ \vdots \\ P_m^{nom} \end{bmatrix}, Q_{DER}^{nom} = \begin{bmatrix} Q_1^{nom} \\ \vdots \\ Q_m^{nom} \end{bmatrix} \quad (11)$$

of the j=1, . . . , m enumerated DERs in the distribution system, along with the values of nominal nodal voltages expressed by the following:

$$V^{nom} = \begin{bmatrix} V_1^{nom} \\ \vdots \\ V_n^{nom} \end{bmatrix} \quad (12)$$

for the i=1, . . . , n nodes in the distribution circuit and the real power to voltage n×m sensitivity matrix expressed by the following expression:

$$S_P = \begin{bmatrix} \delta V_1/\delta P_1 & \cdots & \delta V_1/\delta P_m \\ \vdots & \ddots & \vdots \\ \delta V_n/\delta P_1 & \cdots & \delta V_n/\delta P_m \end{bmatrix} \quad (13)$$

and a reactive power to voltage n×m sensitivity matrix:

$$S_Q = \begin{bmatrix} \delta V_1/\delta Q_1 & \cdots & \delta V_1/\delta Q_m \\ \vdots & \ddots & \vdots \\ \delta V_n/\delta Q_1 & \cdots & \delta V_n/\delta Q_m \end{bmatrix} \quad (14)$$

obtained by the obtained from the perturbation analysis approach previously described. In this variation, the splitting of both real power and reactive power vectors can be expressed by the following:

$$P^{DER} = \begin{bmatrix} P_1 \\ \vdots \\ P_m \end{bmatrix}, Q^{DER} = \begin{bmatrix} Q_1 \\ \vdots \\ Q_m \end{bmatrix} \quad (15)$$

for the m DERs in a distribution system can be computed via a Constrained Linear Least Squares (CLLS) minimization expressed by the following:

$$P^{DER}, Q^{DER} = \min_{P, Q} |V(P, Q)|^2, \quad (16)$$

subject to the constraints $$V(P, Q) = V^{bus} - V^{nom} + S_P P^{nom} + S_Q Q^{nom} - [S_P S_q]\begin{bmatrix} P \\ Q \end{bmatrix}$$

$$\sum_{j=1}^{m} P_j = P^a$$

$$\sum_{j=1}^{m} Q_j = Q^a$$

$$|P_j| \le P_j^m$$

$$|Q_j| \le Q_l^m$$

where $V^{bus}$ indicates the absolute value of the desired nodal or bus voltages required for each node/bus in the distribution system. The above CLLS minimization is known to have a unique global minimum that finds the optimal solution of the splitting of both real power, $P^{DER}$, and reactive power, $Q^{DER}$, vectors to minimize deviations from $V^{bus}$. In this variation, computed real and reactive power values are automatically dispatched to the power sources. This includes the sending commands to customer DERs using the IEEE 2030.5 standard Internet protocol.

In the fourth embodiment, the aggregated real power, $P^a$, and aggregated reactive power, $Q^a$, can be split to the m DERs in a distribution system by taking into account inverter constraints or power limitations of each enumerated DER j=1, . . . , m and taking into account the n×m sensitivity matrices obtained from the perturbation analysis approach described earlier to minimize the power losses due to power distributions in the distribution system. In this variation, power loss is measured by the power loss in each distribution line from a node/bus k to a node/bus p given by:

$$|S_{k,p}| = |S_{p,k}| = |v_k - v_p|^2 \cdot |Y_{k,p}| \quad (17)$$

where $v_k = V_k \cdot e^{j\alpha_k}$, $v_p = V_p \cdot e^{j\alpha_p}$ are the (complex) voltage phasors at node p and k respectively and $Y_{k,p}$ is the complex admittance of the distribution line from node/bus k to node/bus p. For small voltage angle differences $|\alpha_k - \alpha_p|$ typically seen in distribution circuits, the power loss can be approximated by the following expression:

$$|S_{k,p}| \approx (V_k - V_p)^2 \cdot |Y_{k,p}| = (V_k - V_p) \cdot Y_{k,p} \cdot (V_k - V_p)^T \quad (18)$$

allowing the total power losses due to power distributions in the distribution system to be modelled by the vector/matrix multiplication $S = V \cdot Y \cdot V^T$ where V is a vector of appropriately arranged nodal voltage differences $(V_k - V_p)$ and Y is a matrix of appropriately arranged absolute values $|Y_{k,p}|$ of distribution line impedances. Combining this information, this variation minimizes the power losses due to power distributions in the distribution system via a CLLS minimization expressed by the following:

$$P^{DER}, Q^{DER} = \min_{P, Q} |V(P, Q)|^2, \quad (19)$$

subject to the constraints $$V(P, Q) = S_p P^{nom} + S_Q Q^{nom} + [S_p S_q]\begin{bmatrix} P \\ Q \end{bmatrix}$$

$$\sum_{j=1}^{m} P_j = P^a$$

$$\sum_{j=1}^{m} Q_j = Q^a$$

$$|P_j| \le P_j^m$$

$$|Q_J| \le Q_l^m$$

The above CLLS minimization can have a unique global minimum that finds the optimal solution of the splitting of both real power, $P^{DER}$, and reactive power, $Q^{DER}$, vectors to minimize distribution power loss. In this variation, computed real and reactive power values are automatically dispatched to the power sources. This includes the sending commands to customer DERs using the IEEE 2030.5 standard Internet protocol.

In a fifth variation, the aggregated real power, $P^a$, and aggregated reactive power, $Q^a$, can be split to the m DERs in a distribution system by taking into account phase balancing. Customer DERs can be installed on a single phase from the secondary distribution transformer to the DER. This provides the means to balance the current flowing from the distribution substation to the secondary transformers. There will be unbalance current flowing from the secondary transformers to the loads, but since the loads are controlled by the DERs, the distribution circuit can be balanced. This is important since unbalanced loads cause additional power loss by leakage between phases and possible limitations of flow due to too many DERs contributing power to a single phase. This can cause overloads on the circuit and cause power loss to customers.

In a sixth variation, the sensitivity matrix can be used to compute the voltage stability margin of the network. The definition of voltage stability is the slope of the voltage versus reactive power curve. As more real or reactive power is injected into the grid, the negative slope increases until reaching the point of instability. This point can be determine in real time how much power can be injected into the network model until the difference between the voltage computed from the slope of this curve deviates substantially from the voltage computed by the model at the same power level. This is the instability point. The difference between the power injected at this point and the current power is the voltage stability margin. The scheduling algorithm can use this information as a constraint (e.g., net power exchange bounds) the guarantee that the dispatch schedule maintains the voltage stability margin within the constraints.

Figure 9:
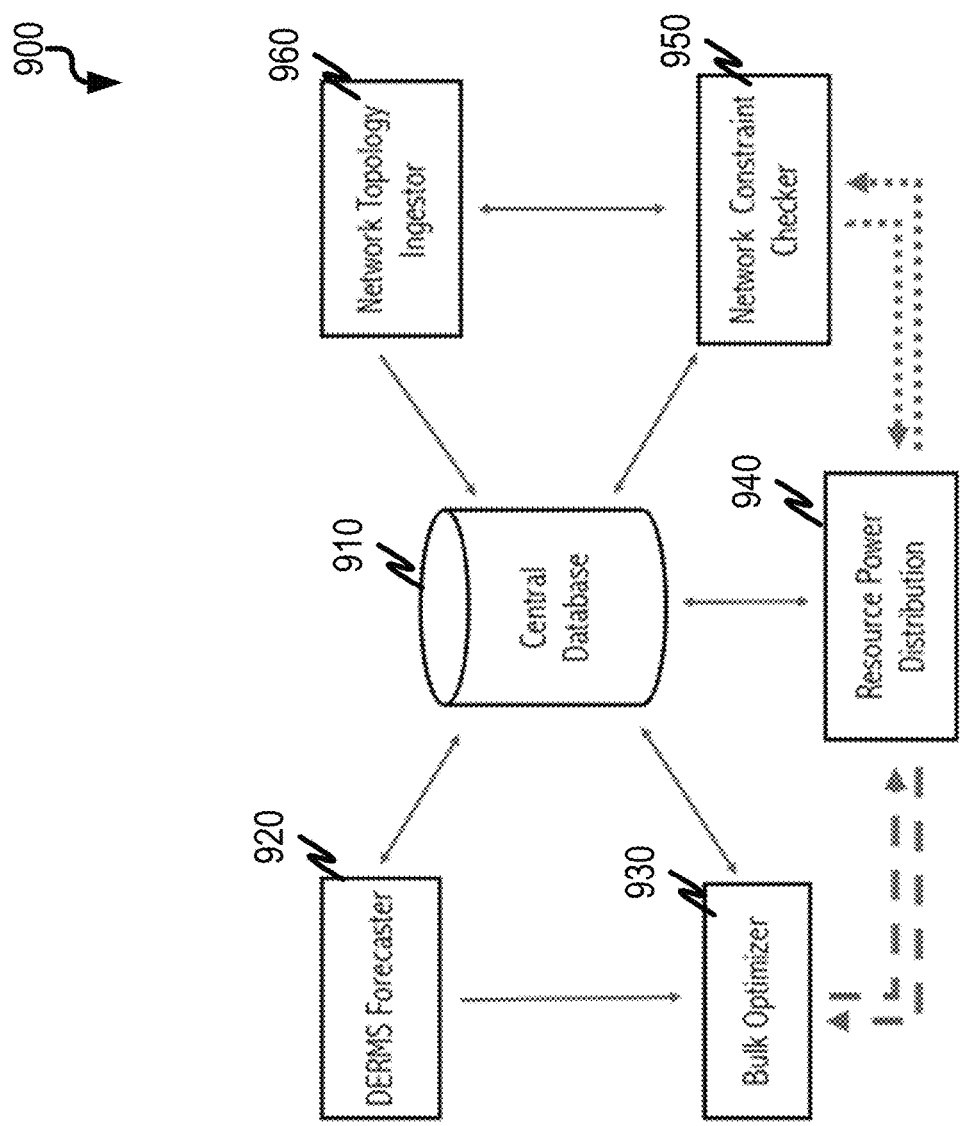
FIG. 9 illustrates a cluster architecture diagram for executing the optimization described herein.

FIG. 9 illustrates a cluster architecture diagram 900 for executing the optimization described herein. The cluster architecture includes a central database 910 for communicating with a plurality of modules including DERMS forecaster 920, bulk optimizer 930, resource power distribution 940, network constrain checker 950, and/or network topology ingestor 960. Each of these modules can operate on one or more computing systems and communicate with the central database via one or more communication networks (e.g., wired and/or wireless). Each of the modules can receive, generate, and/or consume data that can be stored within central database 910.

Network constraint checker 950 can check if any network (e.g., voltage, current) constraints are violated over the entire planning interval (e.g., 24 hours). The network constraint checker 950 ingests the circuit topology from the network topology ingestor 960, switch state information, DER and load real, reactive power to run a load flow program and estimate voltages of buses and currents through branches inside the cluster. If the network constraints are violated, the bulk optimizer 930 re-allocates the bulk power to the DERs using the optimizing algorithm to resolve the network constraint violations.

Forecasting of both power demand and generation can be performed at each cluster within a hierarchy by DERMS forecaster 920. Forecasting is performed based on limited historical data, including day of the week, season, weather conditions such as humidity, temperature, wind speed and direction, solar irradiance, cloud cover etc. Next, the topology and switch state of the network is then ingested to determine the "effective" load/demand and the generation (e.g., DERs available) in order to optimize for dispatch. Third, the optimization is performed using a notion of "bulk power" of the entire cluster i.e., power matching of the total demand and generation in the cluster subject to the active DER and network constraints in the cluster. The optimization is performed using real and reactive power limits as well as SOC limits imposed by the optimizer.

Demand (e.g., load) forecasting can be addressed using statistical analysis of historical time-series data combined with stochastic models to accommodate both other exogenous variables such as but not limited to weather and known time-dependent loads. The statistical model could be updated on a regular basis based on the newly obtained data. The model includes seasonal, monthly, weekly, day of week and special event load terms that are determined by the load modeling software.

The DERMS forecasting 920 retrieves forecasted weather either by event or on a scheduled basis (e.g., every m-time intervals) to forecast the load for the next scheduling period.

Generation forecasting can be addressed only using stochastic models to accommodate exogenous variables such as but not limited to weather or irradiance forecasts. The stochastic model could be updated on a regular basis based on the newly obtained data. The generation forecasting module retrieves forecasted weather either by event or on a scheduled basis (e.g., every m-time intervals) to forecast the load for the next scheduling period.

To handle the time complexity of the problem (especially if N is large), the optimization breaks the problem into sub-problems of smaller n time-period intervals to solve n (e.g., convex) optimization problems, each related to each other by end-conditions via constraints. The optimization module then combines all such smaller n time-period intervals to yield the dispatch plan for N time-period.

Similarly, cluster reactive power is computed using the power system quality objective (e.g. power-factor) for the cluster using the load and generation forecasts.

Consider a distribution grid or a group as shown in FIG. 4 with multiple clusters containing loads and DERs including solar generation (PV), fuel-based generation (DG) such as diesel or gas generation, a set of energy storage (ES) systems and local loads, connected to their clusters.

The following equations describe energy balance of the localized power schedule as well as charge variation of the battery systems considering their efficiencies:

$$P_{l_i} = P_{d_i} + P_{b_i} + P_{s_i} + P_{b_i}, \quad (20)$$

$$P_b^{min} \leq P_{b_i} \leq P_b^{max}, \quad (21)$$

$$0 \leq P_{s_i} \leq P_s^{max}, \text{ and} \quad (22)$$

$$P_d^{max} \leq P_{d_i} \leq P_d^{max}, \quad (23)$$

where $P_{l_i}$ is the forecasted load at any instant i, $P_{d_i}$ is the dispatchable fuel-based power output, $P_{s_i}$ is the controllable solar power output, $P_{b_i}$ is the dispatchable battery power output, $SOC_i$ is the state of charge of the battery at i, $\Delta T$ is the time step of optimization and $\eta_i$ is the battery round-trip efficiency. $SOC_i$ is the state-of-charge of the battery system at any instant i and CB is the capacity of the battery system. $P_b^{min}$, $P_b^{max}$, $P_d^{min}$, $P_d^{max}$, $P_s^{max}$, are the minimum and maximum power limits of the battery system, fuel-based generation and solar systems respectively. $SOC_{min}$ and $SOC_{max}$ are the minimum and maximum state-of-charge limits of the battery system, expressed by the following:

$$SOC_{i+1} = SOC_i + P_{bi} \eta_i \frac{\Delta T}{CB} \quad \text{if } P_{bi} \geq 0 \quad (24)$$

$$SOC_{i+1} = SOC_i + P_{bi} \frac{\Delta T}{\eta_i CB} \quad \text{if } P_{bi} < 0, \text{ and} \quad (25)$$

$$SOC^{min} \leq SOC_i \leq SOC^{max}. \quad (26)$$

With limited storage capacity, the two objectives of increasing PV utilization and decreasing generation variability are conflicting; hence, a trade-off between them may be favorable. Since reliability objective may have higher priority than the economic objective, PV curtailment level $P_s^{max}$ based on the forecasted variability is performed first before determining the optimal DER level for economic criteria. This is determined based on the storage level needed to compensate for power variability due to the inability of traditional generation to react to faster grid events. Once the reliability condition is met, the following objective aims to optimize for the economic objective:

$$J = \min_{P_{di}, P_{si}, P_{bi}} \sum_{i=1}^{N} \alpha_i P_{d_i} + \gamma_i P_{s_i} + \beta_i (P_{b_i} - P_{b_{i-1}})^2. \quad (27)$$

The first term in the cost functions serves to minimize power from traditional fuel-based generation (typically $\alpha_i$ is positive), while the second term aims at maximizing the solar generation (typically $\gamma_i$ is negative) while the third term aims at minimizing the variance of battery power to avoid round-trip losses (typically $\beta_i$ is positive). This optimization should minimize the above cost by scheduling existing DERs subject to their availability and constraints. To minimize the number of spinning generators, this objective function can be computed by iteratively determining $P_d^{max}$ based on the rating of each generator and required spinning reserve. Numerical root-finding methods such as the bisection algorithm can be used to find an optimal value of generator demand limit, $P_d^{max}$ each time the objective function is minimized to compute the minimum spinning generators. Similarly, $P_d^{min}$ is generally the generation minimum limit the distribution grid must maintain to avoid conditions such as reverse power flow.

In the following expression, $$P_d^{max} = \Sigma_n (GR_n * u_n) + SR \quad (28)$$

where $GR_n$ is the generator rating of generator n, $u_n$ is the binary decision if the generator is on or off and SR is the station spinning reserve needed for reliability.

Hence, this translates to solving for the minimum number of generators, an otherwise integer (non-convex) optimization problem using convex methods.

To reduce degree of freedom on the state-of-charge, constraints on the battery system charge level at the beginning and end of the optimization period may be related as follows:

$$SOC_{i=0} = SOC_{i=N} \quad (29)$$

To ensure repeatability of such an optimization algorithm for a day-to-day basis, the state-of-charge may be fixed at a level at a given point in the day such as the following:

$$SOC_{i=p} = SOC_p. \quad (30)$$

Figure 10:
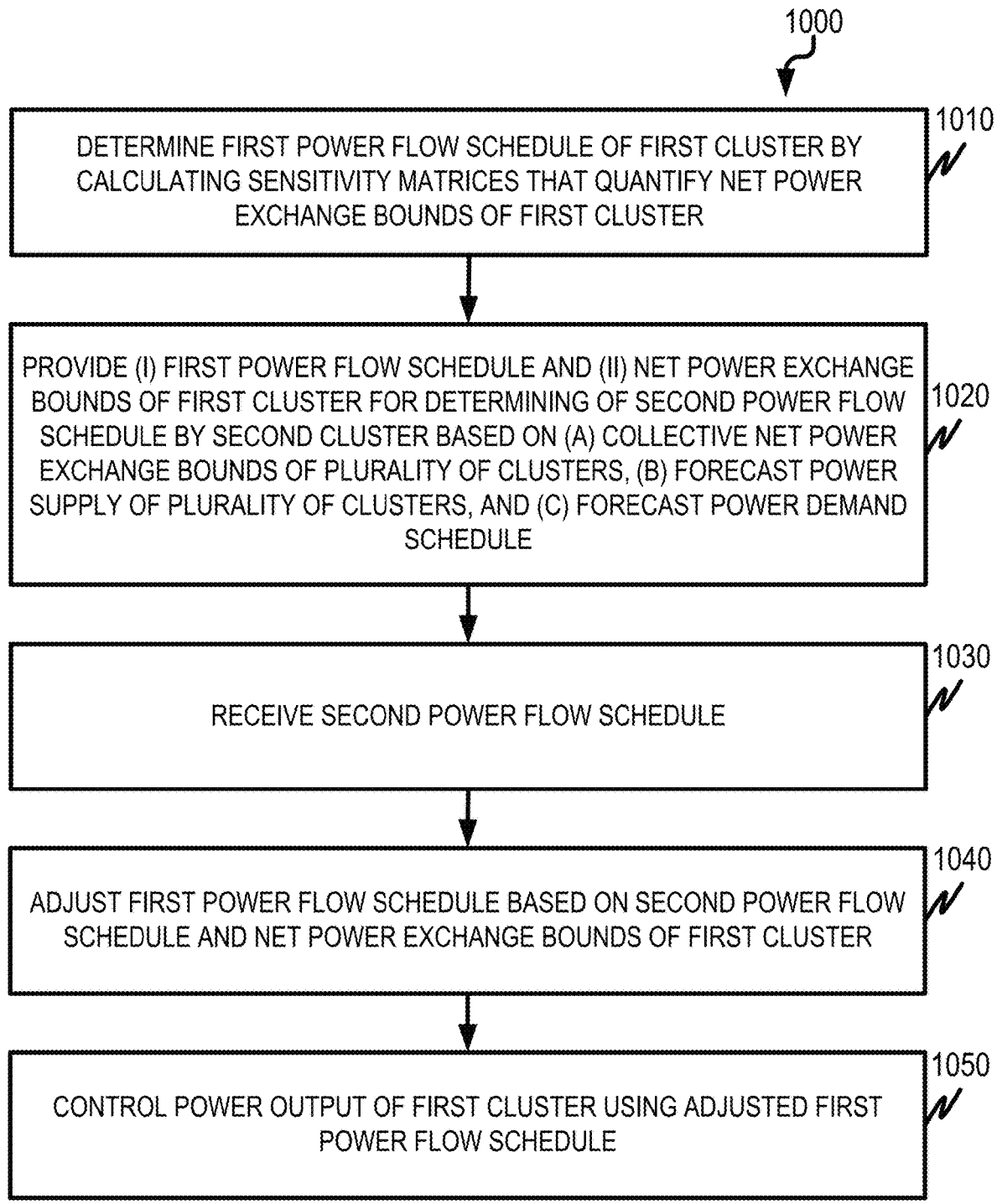
FIG. 10 is a process flow diagram illustrating a method of determining an optimal power profile for a plurality of clusters within a power system having one or more energy storage units from the perspective of a leaf cluster.

FIG. 10 is another process flow diagram 1000 illustrating a method of determining an optimal power profile for a plurality of clusters within a power system having one or more energy storage units from the perspective of a leaf cluster. A first power flow schedule of the first cluster is determined, at 1010, locally within the first cluster, by calculating sensitivity matrices that quantify net power exchange bounds of the first cluster. Each cluster includes a different section of the power system. The first cluster provides, at 1020, to a second cluster via a communication network after the determining, (i) the first power flow schedule and (ii) the net power exchange bounds of the first cluster for determination of a second power flow schedule by the second cluster based on (a) collective net power exchange bounds of the plurality of clusters, (b) a forecast power supply of the plurality of clusters, and (c) a forecast power demand schedule. The first cluster and the second cluster are hierarchically arranged such that the second cluster is higher in a hierarchy than the first cluster. The first cluster receives, at 1030, from the second cluster after the providing, the second power flow schedule. The first power flow schedule is adjusted, at 1040, after the receiving, at 1030, locally within the first cluster, based on the second power schedule and the net power exchange bounds of the first cluster. The power output of the first cluster is controlled, at 1050, using the adjusted first power flow schedule.

Figure 11:
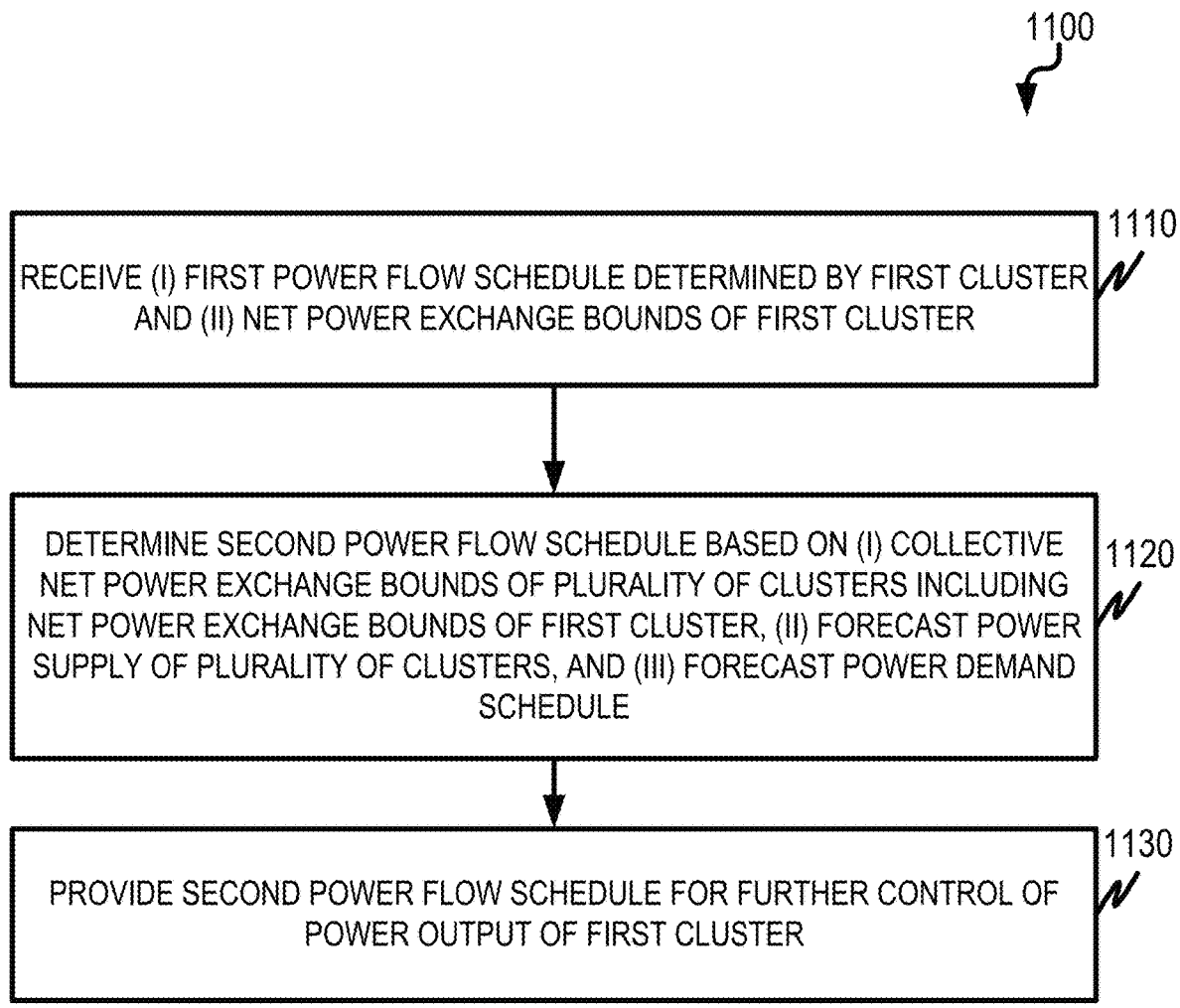
FIG. 11 is another process flow diagram illustrating a method of determining an optimal power profile for a plurality of clusters within a power system having one or more energy storage units from the perspective of a parent cluster.

FIG. 11 is another process flow diagram 1100 illustrating a method of determining an optimal power profile for a plurality of clusters within a power system having one or more energy storage units from the perspective of a parent cluster. A second cluster receives, at 1110, from a first cluster, via a communication network, (i) a first power flow schedule determined by the first cluster and (ii) net power exchange bounds of the first cluster. Each cluster includes a different section of the power system. Locally within the second cluster, a second power flow schedule is determined, at 1120, based on (i) collective net power exchange bounds of the plurality of clusters including the net power exchange bounds of the first cluster, (ii) a forecast power supply of the plurality of clusters, and (iii) a forecast power demand schedule. The first cluster and the second cluster are hierarchically arranged such that the second cluster is higher in a hierarchy than the first cluster. The second cluster provides, at 1130, to the first cluster, via the communication network after the determining, the second power flow schedule for further control of power output of the first cluster.

Figure 12:
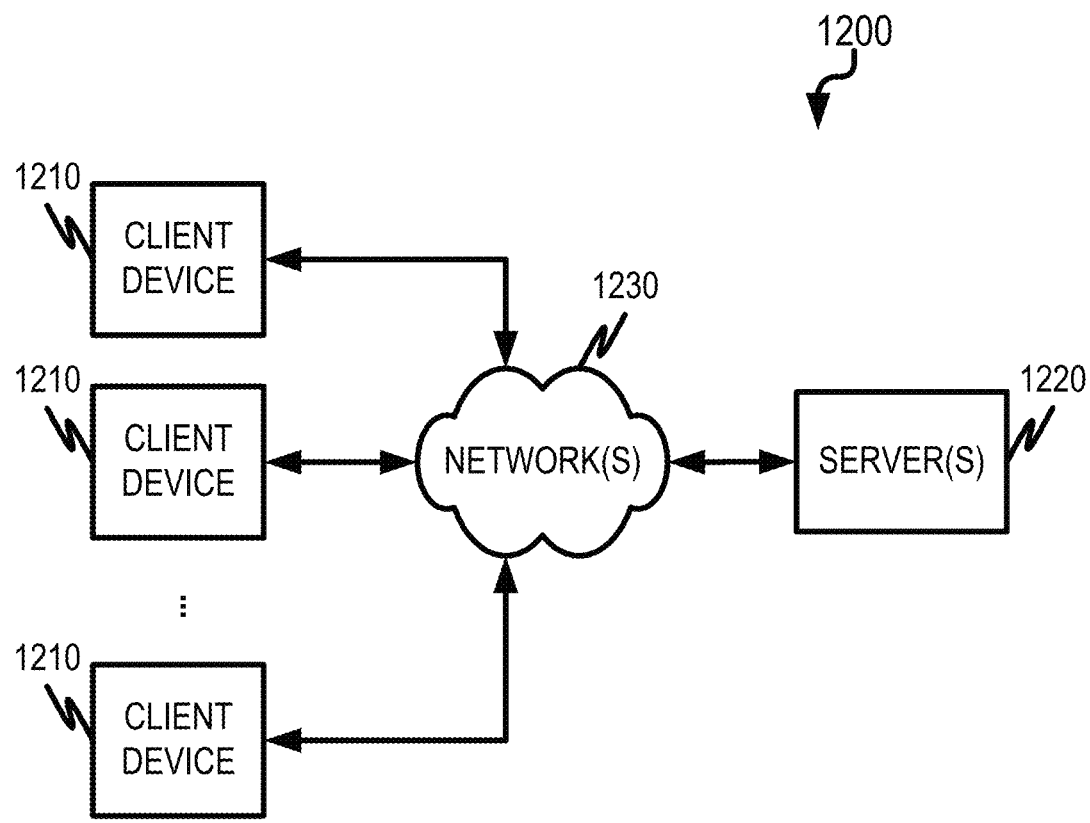
FIG. 12 is a system block diagram illustrating an architecture for use in connection with the current subject matter.

FIG. 12 is a system block diagram illustrating an architecture 1200 for use in connection with the current subject matter. The current subject matter is described in connection with an arrangement involving one or more client devices 1210 and one or more servers 1220 which can communicate over one or more networks 1230. Each of the one or more client devices 1210 and the one or more servers 1220 comprise one or more programmable data processors and memory for storing instructions for executed by such data processor(s). Furthermore, it will be appreciated that each of the client devices 1210 or servers 1220 can comprise more than one computing device depending on the desired configuration and that the illustrations in FIG. 12 is simplified to aid in the understanding of the current subject matter.

The functional blocks described herein can be implemented in commercial computing platforms such as advanced Programmable Logic Controllers (PLCs) or in industrial grade PCs such as the Schweitzer Engineering Laboratories (SEL) 3355 Industrial Personal Computer (PC) that runs multiple tasks, one of which is the controller. The controller processing functionality can be written in any computer language, but one implementation is using C++ running on Windows or Linux operating systems. The output commands from then controller may use standard control protocols such as IEC 61850 Goose or Modbus over Ethernet. In order to maintain high security, fiber optic connections can be used between the controller platform and the providers and/or consumers of the power grid.

One or more aspects or features of the subject matter described herein can be realized in digital electronic circuitry, integrated circuitry, specially designed application specific integrated circuits (ASICs), field programmable gate arrays (FPGAs) computer hardware, firmware, software, and/or combinations thereof. These various aspects or features can include implementation in one or more computer programs that are executable and/or interpretable on a programmable system including at least one programmable processor, which can be special or general purpose, coupled to receive data and instructions from, and to transmit data and instructions to, a storage system, at least one input device, and at least one output device. The programmable system or computing system can include clients and servers. A client and server are generally remote from each other and typically interact through a communication network. The relationship of client and server arises by virtue of computer programs running on the respective computers and having a client-server relationship to each other.

These computer programs, which can also be referred to as programs, software, software applications, applications, components, or code, include machine instructions for a programmable processor, and can be implemented in a high-level procedural language, an object-oriented programming language, a functional programming language, a logical programming language, and/or in assembly/machine language. As used herein, the term "computer-readable medium" refers to any computer program product, apparatus and/or device, such as for example magnetic discs, optical disks, memory, and Programmable Logic Devices (PLDs), used to provide machine instructions and/or data to a programmable processor, including a computer-readable medium that receives machine instructions as a computer-readable signal. The term "computer-readable signal" refers to any signal used to provide machine instructions and/or data to a programmable processor. The computer-readable medium can store such machine instructions non-transitorily, such as for example as would a non-transient solid-state memory or a magnetic hard drive or any equivalent storage medium. The computer-readable medium can alternatively or additionally store such machine instructions in a transient manner, for example as would a processor cache or other random access memory associated with one or more physical processor cores.

Figure 13:
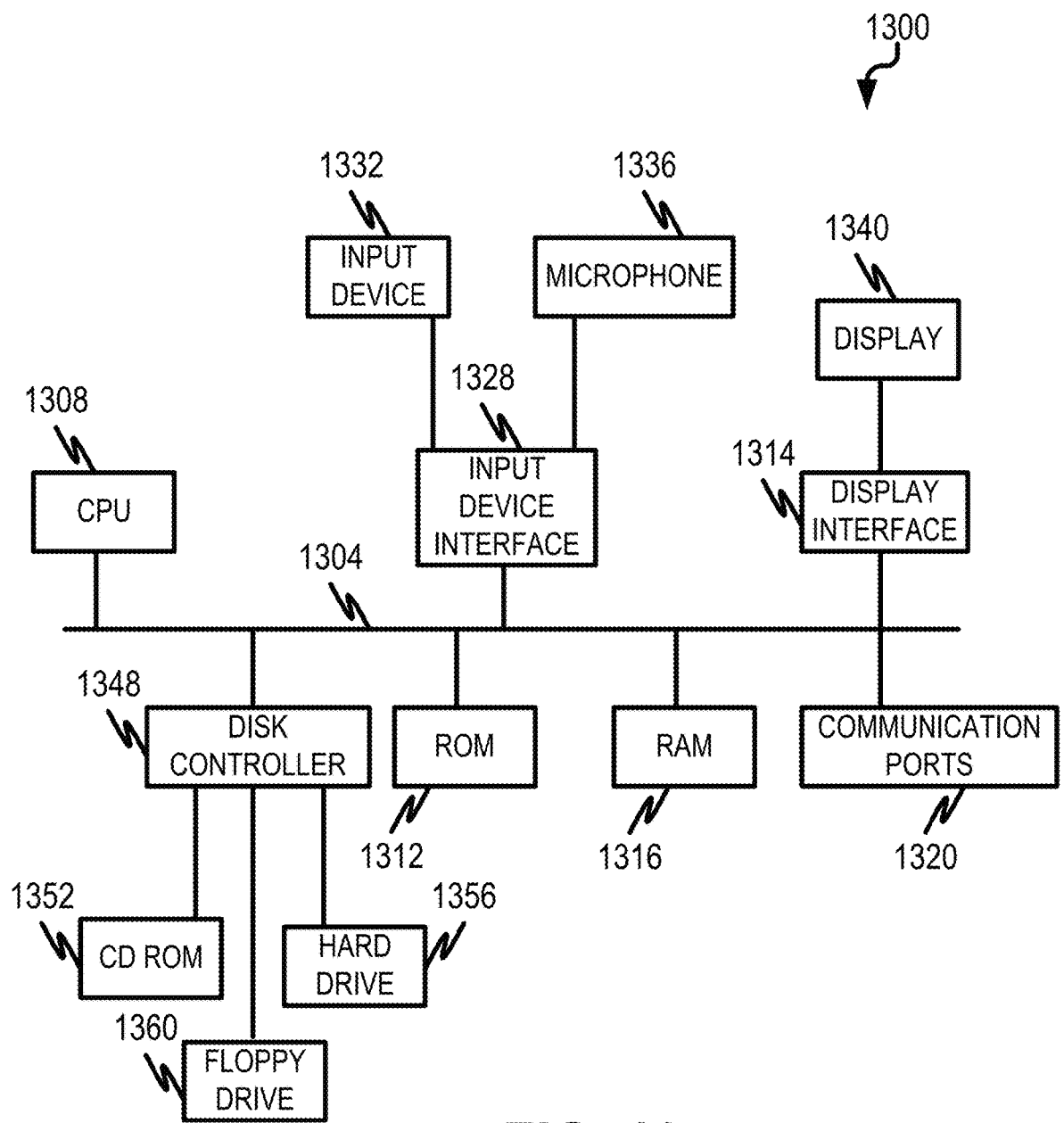
FIG. 13 is a diagram illustrating a sample computing device architecture for implementing various aspects described herein.

FIG. 13 is a diagram illustrating a sample computing device architecture 1300 for implementing various aspects described herein. A system bus 1304 can serve as the information highway interconnecting the other illustrated components of the hardware. A processing system 1308 labeled CPU (central processing unit) (e.g., one or more computer processors/data processors at a given computer or at multiple computers), can perform calculations and logic operations required to execute a program. A non-transitory processor-readable storage medium, such as read only memory (ROM) 1312 and random access memory (RAM) 1316, can be in communication with the processing system 1308 and can include one or more programming instructions for the operations specified here. Optionally, program instructions can be stored on a non-transitory computer-readable storage medium such as a magnetic disk, optical disk, recordable memory device, flash memory, or other physical storage medium.

In one example, a disk controller 1348 can interface one or more optional disk drives to the system bus 1304. These disk drives can be external or internal floppy disk drives such as 1360, external or internal CD-ROM, CD-R, CD-RW or DVD, or solid state drives such as 1352, or external or internal hard drives 1356. As indicated previously, these various disk drives 1352, 1356, 1360 and disk controllers are optional devices. The system bus 1304 can also include at least one communication port 1320 to allow for communication with external devices either physically connected to the computing system or available externally through a wired or wireless network. In some cases, the communication port 1320 includes or otherwise comprises a network interface.

To provide for interaction with a user, the subject matter described herein can be implemented on a computing device having a display 1340 (e.g., a CRT (cathode ray tube) or LCD (liquid crystal display) monitor) for displaying information obtained from the system bus 1304 to the user and an input device 1332 such as keyboard and/or a pointing device (e.g., a mouse or a trackball) and/or a touchscreen by which the user can provide input to the computer. Other kinds of input devices 1332 can be used to provide for interaction with a user as well; for example, feedback provided to the user can be any form of sensory feedback (e.g., visual feedback, auditory feedback by way of a microphone 1336, or tactile feedback); and input from the user can be received in any form, including acoustic, speech, or tactile input. In the input device 1332 and the microphone 1336 can be coupled to and convey information via the system bus 1304 by way of an input device interface 1328. Other computing devices, such as dedicated servers, can omit one or more of the display 1340 and display interface 1314, the input device 1332, the microphone 1336, and input device interface 1328.

In the descriptions above and in the claims, phrases such as "at least one of" or "one or more of" may occur followed by a conjunctive list of elements or features. The term "and/or" may also occur in a list of two or more elements or features. Unless otherwise implicitly or explicitly contradicted by the context in which it is used, such a phrase is intended to mean any of the listed elements or features individually or any of the recited elements or features in combination with any of the other recited elements or features. For example, the phrases "at least one of A and B;" "one or more of A and B;" and "A and/or B" are each intended to mean "A alone, B alone, or A and B together." A similar interpretation is also intended for lists including three or more items. For example, the phrases "at least one of A, B, and C;" "one or more of A, B, and C;" and "A, B, and/or C" are each intended to mean "A alone, B alone, C alone, A and B together, A and C together, B and C together, or A and B and C together." In addition, use of the term "based on," above and in the claims is intended to mean, "based at least in part on," such that an un-recited feature or element is also permissible.

The subject matter described herein can be embodied in systems, apparatus, methods, and/or articles depending on the desired configuration. The implementations set forth in the foregoing description do not represent all implementations consistent with the subject matter described herein. Instead, they are merely some examples consistent with aspects related to the described subject matter. Although a few variations have been described in detail above, other modifications or additions are possible. In particular, further features and/or variations can be provided in addition to those set forth herein. For example, the implementations described above can be directed to various combinations and sub-combinations of the disclosed features and/or combinations and sub-combinations of several further features disclosed above. In addition, the logic flows depicted in the accompanying figures and/or described herein do not necessarily require the particular order shown, or sequential order, to achieve desirable results. Other implementations may be within the scope of the following claims.

What is claimed is:

1. A method of determining an optimal power profile for a plurality of clusters within a power system having one or more energy storage units, the method comprising:

determining, locally within a first cluster of the plurality of clusters, a first power flow schedule of the first cluster by calculating sensitivity of net power exchange bounds of the first cluster, wherein each cluster comprises a different section of the power system;

providing, by the first cluster to a second cluster via a communication network after the determining, (i) the first power flow schedule and (ii) the net power exchange bounds of the first cluster for determination of a second power flow schedule by the second cluster based on (a) collective net power exchange bounds of the plurality of clusters, (b) a forecast power supply of the plurality of clusters, and (c) a forecast power demand schedule, wherein the first cluster and the second cluster are hierarchically arranged such that the second cluster is higher in a hierarchy than the first cluster;

receiving, by the first cluster from the second cluster after the providing, the second power flow schedule;

adjusting, after the receiving, locally within the first cluster, the first power flow schedule based on the second power schedule and the net power exchange bounds of the first cluster; and controlling power output of the first cluster using the adjusted first power flow schedule.

2. The method of claim 1, wherein the sensitivity comprises matrices associated with each cluster of the plurality of clusters comprise (i) a real power voltage sensitivity matrix, $S_P$, and (ii) a reactive power voltage sensitivity matrix, $S_Q$, wherein the real power voltage sensitivity matrix is expressed by:

$$S_P = \begin{bmatrix} \delta V_1/\delta P_1 & \cdots & \delta V_1/\delta P_m \\ \vdots & \ddots & \vdots \\ \delta V_n/\delta P_1 & \cdots & \delta V_n/\delta P_m \end{bmatrix}$$

wherein n is a node within a respective cluster, m is a number of distributed energy resources within the respective cluster, V is a voltage of the node, P is a real power of the node, and δ is a change in voltage of the node, and the reactive power voltage sensitivity matrix, $S_Q$, expressed by:

$$S_Q = \begin{bmatrix} \delta V_1/\delta Q_1 & \cdots & \delta V_1/\delta Q_m \\ \vdots & \ddots & \vdots \\ \delta V_n/\delta Q_1 & \cdots & \delta V_n/\delta Q_m \end{bmatrix}$$

wherein Q is a reactive power of the node.

3. The method of claim 1, wherein the determining, the providing, the receiving, and the adjusting occur over a planning period comprising a plurality of intervals.

4. The method of claim 3, wherein a State of Charge (SoC) of each energy storage unit is managed towards a targeted SoC level at an end of the planning period.

5. The method of claim 4, wherein the planning period is a sliding window of time over which the first power flow schedule, the second power flow schedule, and the third power flow schedule are computed.

6. The method of claim 1, wherein the first cluster comprises at least one of a gas turbine, a diesel engine, a coal fired generator, a solar photovoltaic panel, a wind turbine, a hydro turbine, a battery, a distributed energy resource, an aggregator for managing distributed energy resources, a generation facility energy management system, or a virtual power plant.

7. The method of claim 1, wherein the first power flow schedule is determined by calculating a standard deviation of voltages within the first cluster, wherein the standard deviation is used to identify a lowest value of an average voltage of the first cluster.

8. The method of claim 1, wherein each of the first power flow schedule, the second power flow schedule, and the third power flow schedule comprise at least one of a real power flow, a reactive power flow, or an apparent power flow.

9. The method of claim 1, wherein each of the first cluster and the second cluster is at least one of an alternating current (AC) cluster or a direct current (DC) cluster.

10. The method of claim 1, wherein the communication network comprises at least one of a wired communication network or a wireless communication network.

11. The method of claim 1, wherein the net power exchange bounds of each cluster comprises (i) a minimum net power exchange bound and (ii) a maximum net power exchange bound.

12. A method of determining an optimal power profile for a plurality of clusters of a power system having one or more energy storage units, the method comprising:

receiving, from a first cluster by a second cluster via a communication network, (i) a first power flow schedule determined by the first cluster and (ii) net power exchange bounds of the first cluster, wherein each cluster comprises a different section of the power system;

determining, locally within the second cluster, a second power flow schedule based on (i) collective net power exchange bounds of the plurality of clusters including the net power exchange bounds of the first cluster, (ii) a forecast power supply of the plurality of clusters, and (iii) a forecast power demand schedule, wherein the first cluster and the second cluster are hierarchically arranged such that the second cluster is higher in a hierarchy than the first cluster;

providing, to the first cluster from the second cluster via the communication network after the determining, the second power flow schedule; and controlling power output of the first cluster using the second power flow schedule.

13. The method of claim 12, wherein the receiving, the determining, and the providing occur over a planning period comprising a plurality of intervals.

14. The method of claim 13, wherein a State of Charge (SoC) of each energy storage unit is managed towards a targeted SoC level at an end of the planning period.

15. The method of claim 13, wherein the planning period is a sliding window of time over which the first power flow schedule and the second power flow schedule are computed.

16. The method of claim 12, wherein the first cluster comprises at least one of a gas turbine, a diesel engine, a coal fired generator, a solar photovoltaic panel, a wind turbine, a hydro turbine, a battery, a distributed energy resource, an aggregator for managing distributed energy resources, a generation facility energy management system, or a virtual power plant.

17. The method of claim 12, wherein the first power flow schedule is determined by calculating a standard deviation of voltages within the first cluster, wherein the standard deviation is used to identify a lowest value of an average voltage of the first cluster.

18. The method of claim 12, wherein each of the first power flow schedule and the second power flow schedule comprise at least one of a real power flow, a reactive power flow, or an apparent power flow.

19. The method of claim 12, wherein each of the first cluster and the second cluster is at least one of an alternating current (AC) cluster or a direct current (DC) cluster.

20. The method of claim 12, wherein the communication network comprises at least one of a wired communication network or a wireless communication network.

21. The method of claim 12, wherein the net power exchange bounds of each cluster comprises (i) a minimum net power exchange bound and (ii) a maximum net power exchange bound.

22. A system for determining an optimal power profile for a plurality of clusters of a power system having one or more energy storage units, the system comprising:

at least one data processor;

memory storing instructions, which when executed by at least one data processor, result in operations comprising:

determining, locally within a first cluster of the plurality of clusters, a first power flow schedule of the first cluster by calculating sensitivity of the net power exchange bounds of the first cluster, wherein each cluster comprises a different section of the power system;

providing, by the first cluster to a second cluster via a communication network after the determining, (i) the first power flow schedule and (ii) the net power exchange bounds of the first cluster for determination of a second power flow schedule by the second cluster based on (i) collective net power exchange bounds of the plurality of clusters, (ii) a forecast power supply of the plurality of clusters, and (iii) a forecast power demand schedule, wherein the first cluster and the second cluster are hierarchically arranged such that the second cluster is higher in a hierarchy than the first cluster;

receiving, by the first cluster from the second cluster after the providing, the second power flow schedule;

adjusting, after the receiving, locally within the first cluster, the first power flow schedule based on the second power schedule and the net power exchange bounds of the first cluster; and controlling power output of the first cluster using the adjusted first power flow schedule.

23. A system for determining an optimal power profile for a plurality of clusters of a power system having one or more energy storage units, the system comprising:

at least one data processor;

memory storing instructions, which when executed by at least one data processor, result in operations comprising:

receiving, from a first cluster by a second cluster via a communication network, (i) a first power flow schedule determined by the first cluster and (ii) net power exchange bounds of the first cluster, wherein each cluster comprises a different section of the power system;

determining, locally within the second cluster, a second power flow schedule based on (i) collective net power exchange bounds of the plurality of clusters including the net power exchange bounds of the first cluster, (ii) a forecast power supply of the plurality of clusters, and (ii) a forecast power demand schedule, wherein the first cluster and the second cluster are hierarchically arranged such that the second cluster is higher in a hierarchy than the first cluster;

providing, to the first cluster from the second cluster via the communication network after the determining, the second power flow schedule; and controlling power output of the first cluster using the second power flow schedule.

\* \* \* \* \*